United States Patent
Sweetnam et al.

(10) Patent No.: US 12,157,941 B2
(45) Date of Patent: Dec. 3, 2024

(54) ULTRAVIOLET RADIATION AND ATOMIC OXYGEN BARRIER FILMS AND METHODS OF MAKING AND USING THE SAME

(71) Applicant: 3M INNOVATIVE PROPERTIES COMPANY, St. Paul, MN (US)

(72) Inventors: Sean M. Sweetnam, Minneapolis, MN (US); Stephen P. Maki, North St. Paul, MN (US); Timothy J. Hebrink, Scandia, MN (US); Daniel M. Pierpont, North St. Paul, MN (US); Mark D. Weigel, Hugo, MN (US); David J. Rowe, Roseville, MN (US); Brandon R. Pietz, St. Paul, MN (US); Christopher S. Lyons, St. Paul, MN (US); Kevin D. Hagen, St. Paul, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 18/559,484

(22) PCT Filed: Mar. 9, 2022

(86) PCT No.: PCT/IB2022/052111
§ 371 (c)(1),
(2) Date: Nov. 7, 2023

(87) PCT Pub. No.: WO2022/243756
PCT Pub. Date: Nov. 24, 2022

(65) Prior Publication Data
US 2024/0229227 A1    Jul. 11, 2024

Related U.S. Application Data

(60) Provisional application No. 63/201,867, filed on May 17, 2021.

(51) Int. Cl.
*C23C 14/12* (2006.01)
*C08J 7/04* (2020.01)
(Continued)

(52) U.S. Cl.
CPC ............. *C23C 14/35* (2013.01); *C08J 7/0423* (2020.01); *C23C 14/0036* (2013.01);
(Continued)

(58) Field of Classification Search
CPC . C23C 14/35; C23C 14/0036; C23C 14/0676; C23C 14/08; C23C 14/12;
(Continued)

(56) References Cited

U.S. PATENT DOCUMENTS 3,601,471 A    8/1971    Seddon
3,682,528 A    8/1972    Apfel et al.
(Continued)

FOREIGN PATENT DOCUMENTS

CN    104244547 B    3/2017
CN    105273189 B    5/2018
(Continued)

OTHER PUBLICATIONS

Affinito, "Polymer-Oxide Transparent Barrier Layers", Society of Vacuum Coaters, 39th Annual Technical Conference Proceedings, 1996, pp. 392-397.
(Continued)

*Primary Examiner* — K. Boyle
(74) *Attorney, Agent, or Firm* — Thomas M. Spielbauer

(57) ABSTRACT

Barrier films including a (co)polymeric substrate, at least one dyad on the substrate, each dyad made of a (co)polymer layer and an oxide layer overlaying the (co)polymer layer, and an outer (co)polymer layer overlaying the dyads. Optionally, at least one outer oxide layer overlays the outer (co)polymer layer. The barrier films transmit visible light
(Continued)

and transmits, at an incident light angle of at least one of 0°, 30°, 45°, 60°, or 75°, at most 70 percent of incident ultraviolet light at a wavelength range from at least 100 nanometers to 400 nanometers or in a wavelength range from at least 100 nm to 350 nm. The barrier films exhibit atomic oxygen degradation of less than $1 \times 10^{-20}$ mg/atom. The barrier films may be applied to decorative objects or electronic devices, (e.g., light receiving or emitting devices, in a satellite or aircraft. Methods of making the barrier films also are disclosed.

19 Claims, 2 Drawing Sheets

(51) Int. Cl.
    *C23C 14/00* (2006.01)
    *C23C 14/06* (2006.01)
    *C23C 14/08* (2006.01)
    *C23C 14/24* (2006.01)
    *C23C 14/35* (2006.01)
    *C23C 14/58* (2006.01)

(52) U.S. Cl.
    CPC .......... *C23C 14/0676* (2013.01); *C23C 14/08* (2013.01); *C23C 14/12* (2013.01); *C23C 14/24* (2013.01); *C23C 14/5833* (2013.01); *C08J 2323/28* (2013.01); *C08J 2433/08* (2013.01); *C08J 2467/02* (2013.01)

(58) Field of Classification Search
    CPC .... C23C 14/24; C23C 14/5833; C08J 7/0423; C08J 2323/28; C08J 2433/08; C08J 2467/02
    See application file for complete search history.

(56) References Cited

U.S. PATENT DOCUMENTS

| | | |
|---|---|---|
| 4,696,719 A | 9/1987 | Bischoff |
| 4,722,515 A | 2/1988 | Ham |
| 4,842,893 A | 6/1989 | Yializis et al. |
| 4,954,371 A | 9/1990 | Yializis |
| 5,018,048 A | 5/1991 | Shaw et al. |
| 5,032,461 A | 7/1991 | Shaw et al. |
| 5,097,800 A | 3/1992 | Shaw et al. |
| 5,125,138 A | 6/1992 | Shaw et al. |
| 5,440,446 A | 8/1995 | Shaw et al. |
| 5,504,134 A | 4/1996 | Palmer et al. |
| 5,547,908 A | 8/1996 | Furuzawa et al. |
| 5,876,688 A | 3/1999 | Laundon |
| 5,919,316 A | 7/1999 | Bogorad et al. |
| 6,045,864 A | 4/2000 | Lyons et al. |
| 6,214,422 B1 | 4/2001 | Yializis |
| 6,231,939 B1 | 5/2001 | Shaw et al. |
| 6,361,869 B1 | 3/2002 | Manners et al. |
| 6,449,093 B2 | 9/2002 | Hebrink et al. |
| 6,744,561 B2 | 6/2004 | Condo et al. |
| 6,783,349 B2 | 8/2004 | Neavin et al. |
| 6,872,457 B2 | 3/2005 | Yamaguchi et al. |
| 6,991,826 B2 | 1/2006 | Pellerite et al. |
| 9,725,601 B2 | 8/2017 | Islam |
| 9,790,396 B2 | 10/2017 | Klun et al. |
| 9,982,160 B2 | 5/2018 | Klun et al. |
| 10,011,735 B2 | 7/2018 | Klun et al. |
| 10,533,111 B2 | 1/2020 | Klun et al. |
| 10,611,130 B2 | 4/2020 | Guénanten et al. |
| 10,774,236 B2 | 9/2020 | Klun et al. |
| 10,804,419 B2 | 10/2020 | Klun et al. |
| 2006/0084780 A1 | 4/2006 | Hebrink et al. |
| 2008/0160185 A1 | 7/2008 | Endle et al. |
| 2015/0194541 A1* | 7/2015 | Spagnola .............. B32B 27/286 427/407.1 |
| 2017/0165947 A1 | 6/2017 | Murakami et al. |
| 2019/0023468 A1* | 1/2019 | Ishii ...................... B65D 65/40 |
| 2020/0009829 A1 | 1/2020 | Shoda et al. |

FOREIGN PATENT DOCUMENTS

| | | |
|---|---|---|
| CN | 108598198 A | 9/2018 |
| JP | 4016844 B2 | 12/2007 |
| JP | 5893251 B2 | 3/2016 |
| WO | 1997000899 A1 | 1/1997 |
| WO | 2000026973 A1 | 5/2000 |
| WO | 2008083308 A1 | 7/2008 |
| WO | 2013066459 A1 | 5/2013 |
| WO | 2013066460 A1 | 5/2013 |
| WO | 2020070589 A1 | 4/2020 |

OTHER PUBLICATIONS

Affinito, "Vacuum Deposited Polymer/Metal Multilayer Films for Optical Application", Thin Solid Films, Dec. 1995, vol. 270, No. 01-02, pp. 43-48.

International Search Report for PCT International Application No. PCT/IB2022/052111, mailed on May 23, 2022, 3 pages.

Roehrig, "Use of Evaporated Acrylate Coatings to Smooth the Surface of Polyester and Polypropylene Film Substrates", Journal of Plastic Film & Sheeting, Jul. 1997, vol. 13, pp. 235-251.

Shaw, "A New High-Speed Process for Vapor Depositing Acrylate Thin Films: An Update", Society of Vacuum Coaters, 36th Annual Technical Conference Proceedings, 1993, pp. 348-351.

Shaw, "A New Vapor Deposition Process for Coating Paper and Polymer Webs", Technical Paper Presented at 6th International Vacuum Coating Conference, 1992, pp. 18-24.

Shaw, "Use of Vapor Deposited Acrylate Coatings to Improve the Barrier Properties of Metallized Film", Society of Vacuum Coaters, 37th Annual Technical Conference Proceedings, 1994, pp. 240-247.

* cited by examiner

ULTRAVIOLET RADIATION AND ATOMIC OXYGEN BARRIER FILMS AND METHODS OF MAKING AND USING THE SAME

CROSS REFERENCE TO RELATED APPLICATIONS

This application is a national stage filing under 35 U.S.C. 371 of PCT/IB2022/052111, filed Mar. 9, 2022, which claims the benefit of US Application No. 63/201,867, filed May 17, 2021, the disclosure of which is incorporated by reference in its/their entirety herein.

BACKGROUND

There is a class of devices which operate at high altitude for extended durations. Some examples of these devices include cube-sats, nanosatellites, high altitude long endurance unmanned aerial vehicles (e.g., drones), and high-altitude pseudo-satellites. These devices often rely on photovoltaic arrays for power generation in order to remain aloft for long periods of time. The photovoltaic arrays may be covered by a visible light-transmissive film in order to protect the arrays from mechanical and chemical degradation during operation. The devices typically operate at altitudes ranging from 20-2000 km, where the thin atmosphere absorbs little solar radiation. The high-altitude devices are thus exposed to the more intense AM0 solar spectrum and to a higher intensity of ultraviolet (UV) radiation, particularly UV-C radiation, than is present in the AM1.5 solar spectrum encountered in Earth terrestrial conditions. The high-altitude devices also may be exposed to atomic oxygen which can damage oxygen-sensitive electronic components.

SUMMARY

UV radiation and more particularly UV-C radiation and atomic oxygen can be very damaging to (co)polymeric films and electronic devices, such as photovoltaic devices, at high altitudes, in the upper Earth atmosphere and in outer space. Thus, there is a need for protective barrier films or layers that can withstand extended exposure to UV radiation, more particularly UV-C radiation, as well as atomic oxygen. There also is a need for barrier films for electronic devices that exhibit antistatic or static electricity dissipating properties.

We have discovered UV radiation (UV-A, UV-B and/or UV-C) and atomic oxygen resistant barrier films that are especially useful for extending the life of decorative objects, particularly decorative objects including a graphic film, a paint, an ink, a stain, a dye, a lacquer, or a combination thereof, and electronic devices, particularly electronic devices including a light emitting device, a light receiving device such as a photovoltaic device, a thin film transistor or a combination thereof, exposed to high levels of UV (particularly UV-C) radiation and atomic oxygen, especially when the decorative objects or electronic devices are components of a satellite or aircraft operating at high altitudes, in the upper Earth atmosphere and in outer space.

Thus, in one aspect, the present disclosure describes barrier films including a substrate comprised of a (co)polymer, at least one dyad positioned on the substrate and an outer (co)polymer layer overlaying the at least one dyad. The at least one dyad includes a (co)polymer layer overlaying the substrate and an oxide layer overlaying the (co)polymer layer. Optionally, at least one outer oxide layer overlays the outer (co)polymer layer. The barrier films transmit visible light and transmits, at an incident light angle of at least one of 0°, 30°, 45°, 60°, or 75°, at most 70 percent of incident ultraviolet light in a wavelength range from at least 100 nanometers to 400 nanometers or more preferably in a wavelength range from at least 100 nm to 350 nm. The barrier films also exhibit an atomic oxygen degradation, when tested according to the Atomic Oxygen Degradation Test described herein, of less than $1 \times 10^{-20}$ mg/atom, $1 \times 10^{-21}$ mg/atom, or $1 \times 10^{-22}$ mg/atom.

In another aspect, the barrier film of any of the foregoing embodiments may be applied to a major surface of an electronic device, the electronic device further comprising a light emitting device, a light receiving device, a photovoltaic device, a thin film transistor or a combination thereof. Optionally, the electronic device is a component of a satellite or aircraft, such as a pilotless aerial surveillance aircraft (e.g., a drone).

In yet another aspect, the present disclosure describes a method of making the barrier film according to any of the preceding embodiments. The method includes providing the substrate, applying at least one dyad to the substrate by applying a (co)polymer layer overlaying the substrate and applying an oxide layer overlaying the (co)polymer layer and applying an outer (co)polymer layer overlaying the at least one dyad. Optionally, the method includes applying at least one outer oxide layer overlaying the outer (co)polymer layer.

Various unexpected results and advantages are obtained in exemplary embodiments of the disclosure. One such advantage of exemplary embodiments of the present disclosure is that the barrier films transmit visible light and transmit, at an incident light angle of at least one of 0°, 30°, 45°, 60°, or 75°, at most 70 percent of incident ultraviolet light in a wavelength range from at least 100 nanometers to 400 nanometers or more preferably in a wavelength range from at least 100 nm to 350 nm.

An additional advantage of exemplary embodiments is that the barrier films also exhibit an atomic oxygen degradation, when tested according to the Atomic Oxygen Degradation Test described herein, of less than $1 \times 10^{-20}$ mg/atom, $1 \times 10^{-21}$ mg/atom, or $1 \times 10^{-22}$ mg/atom.

Yet another advantage of certain exemplary embodiments is that the barrier films possess antistatic or static electricity dissipation properties, such that the exemplary barrier films exhibit a static decay time, when tested according to the Static Decay Time Test described herein, of less than 90 minutes, 80 minutes, 70 minutes, 60 minutes, 50 minutes, 40 minutes, 30 minutes, 20 minutes, 10 minutes or even one minute.

A further advantage of exemplary embodiments is to enable a high speed, roll-to-roll continuous production process for the barrier films of the present disclosure.

These and other unexpected results and advantages are within the scope of the following exemplary embodiments.

LISTING OF EXEMPLARY EMBODIMENTS

Embodiment A: A barrier film comprising
a substrate comprised of a (co)polymer;
at least one dyad positioned on the substrate, wherein the at least one dyad is comprised of a (co)polymer layer overlaying the substrate and an oxide layer overlaying the (co)polymer layer;
an outer (co)polymer layer overlaying the at least one dyad; and
optionally, at least one outer oxide layer overlaying the outer (co)polymer layer, wherein the barrier film transmits visible light and transmits, at an incident light angle of at least one of 0°, 30°, 45°, 60°, or 75°, at most 70 percent of incident ultraviolet light in a wavelength range from at least 100 nanometers to 400 nanometers or in a wavelength range from at least 100 nm to 350 nm, and further wherein the barrier film exhibits an atomic oxygen degradation, when tested according to the Atomic Oxygen Degradation Test, of less than $1\times10^{-20}$ mg/atom, $1\times10^{-21}$ mg/atom, or $1\times10^{-22}$ mg/atom.

Embodiment B: The barrier film of Embodiment A, wherein the substrate (co)polymer comprises a fluoropolymer, a polyimide (co)polymer, a cyclic olefin (co)polymer, poly(ethylene terephthalate), poly(ethylene naphthalate), poly(methyl methacrylate), polycarbonate, polypropylene, polyethylene, polysulfone, poly(ether sulfone), polyurethane, polyamide, poly(vinyl butyral), poly(vinyl chloride), poly(ethylene sulfide poly(imide benzoxazole) and polybenzoxazole, optionally wherein the fluoropolymer comprises tetrafluoroethylene, hexafluoropropylene, vinylidene fluoride, a perfluoroalkoxy alkane, or a combination thereof.

Embodiment C: The barrier film of Embodiments A and/or B, wherein the at least one dyad is a plurality of dyads, optionally wherein the plurality of dyads is two dyads, three dyads, four dyads, five dyads, or six dyads.

Embodiment D: The barrier film of Embodiments A, B and/or C, wherein each (co)polymer layer in the at least one dyad and the outer (co)polymer layer comprises a (co)polymer selected from an olefinic (co)polymer, a (meth)acrylate (co)polymer, a urethane (co)polymer, a fluoropolymer, a silicone (co)polymer, or a combination thereof.

Embodiment E: The barrier film of Embodiments A, B, C and/or D, wherein the outer (co)polymer layer overlaying the at least one dyad comprises at least one of a UV mirror film, a multilayer optical film, a heat sealable encapsulating film, or a combination thereof, optionally wherein the outer (co)polymer layer comprises an olefinic (co)polymer selected from low density polyethylene, linear low density polyethylene, ethylene vinyl acetate, polyethylene methyl acrylate, polyethylene octene, polyethylene propylene, polyethylene butene, polyethylene maleic anhydride, polymethyl pentene, polyisobutene, polyisobutylene, polyethylene propylene diene, cyclic olefin (co)polymers, and blends thereof.

Embodiment F: The barrier film of any one of Embodiments A, B, C, D and/or E, wherein the (co)polymer is crosslinked.

Embodiment G: The barrier film of any one of Embodiments A, B, C, D, E and/or F, wherein at least one (co)polymer layer in the at least one dyad or the outer (co)polymer layer further comprises an ultraviolet radiation absorber, a hindered amine light stabilizer, an antioxidant, or a combination thereof.

Embodiment H: The barrier film of Embodiment G, wherein the ultraviolet radiation absorber is selected from a benzotriazole compound, a benzophenone compound, a triazine compound, or a combination thereof.

Embodiment I: The barrier film of any one of Embodiments A, B, C, D, E, F, G and/or H, wherein each of the oxide layers in the at least one dyad and the optional at least one outer oxide layer overlaying the outer (co)polymer layer comprises a metal oxide selected from silicon oxide, silica alumina oxide, gallium oxide, magnesium oxide, niobium oxide, titanium dioxide, yttrium oxide, zinc oxide, tin oxide, nickel oxide, aluminum doped zinc oxide, indium tin oxide, zirconium oxynitride, hafnia, alumina, alumina doped silica, lanthanum fluoride, neodymium fluoride, aluminum fluoride, magnesium fluoride, calcium fluoride, or a combination thereof.

Embodiment J: The barrier film of Embodiment I, wherein the optional at least one outer oxide layer overlaying the outer (co)polymer layer is present, and further wherein the at least one outer oxide layer overlaying the outer (co)polymer layer comprises at least one layer comprised of hafnia, zirconium oxynitride, silicon oxide, gallium oxide, indium tin oxide, niobium oxide, titanium dioxide, zinc oxide, tin oxide, nickel oxide, silica aluminum oxide, aluminum doped zinc oxide, or a combination thereof, optionally wherein the barrier film exhibits a static decay time, when tested according to the Static Decay Time Test, of less than 90 minutes.

Embodiment K: The barrier film of Embodiment J, wherein the at least one outer oxide layer comprises a plurality of outer oxide layers comprised of hafnia, zirconium oxynitride, silicon oxide, gallium oxide, indium tin oxide, tin oxide, nickel oxide, silica aluminum oxide, niobium oxide, titanium dioxide, zinc oxide, aluminum doped zinc oxide, or a combination thereof and a top layer comprised of silicon oxide.

Embodiment L: The barrier film of any one of claims Embodiments A, B, C, D, E, F, G, H, I and/or K, further comprising an adhesion-promoting layer positioned between at least one of the substrate and the at least one dyad, the (co)polymer layer and the oxide layer of the at least one dyad, or the oxide layer and the outer (co)polymer layer, optionally wherein the adhesion promoting layer comprises the reaction product of at least one silane compound.

Embodiment M: The barrier film of any one of Embodiments A, B, C, D, E, F, G, H, I, K and/or L, wherein incident visible light transmission through the barrier film is greater than 30 percent in a wavelength range from at least 400 nanometers to 1500 nanometers.

Embodiment N: The barrier film of any one of Embodiments A, B, C, D, E, F, G, H, I, K, L and/or M applied to a major surface of a decorative object, the decorative object further comprising a graphic film, a paint, an ink, a stain, a dye, a lacquer, or a combination thereof, or an electronic device, the electronic device further comprising a light emitting device, a light receiving device, a photovoltaic device, a thin film transistor or a combination thereof, optionally wherein the decorative object or electronic device is a component of a satellite or aircraft.

Embodiment O: A method of making the barrier film of any one of Embodiments A, B, C, D, E, F, G, H, I, K, L, M and/or N, comprising:
providing the substrate;
applying at least one dyad to the substrate by applying a (co)polymer layer overlaying the substrate and applying an oxide layer overlaying the (co)polymer layer;
applying an outer (co)polymer layer overlaying the at least one dyad; and
optionally, applying at least one outer oxide layer overlaying the outer (co)polymer layer.

Embodiment P: The process of Embodiment O, wherein applying the (co)polymer layer to the substrate comprises:
evaporating at least one monomer, oligomer or pre-(co)polymer;
condensing the at least one monomer, oligomer or pre-(co)polymer on the substrate; and
curing the at least one monomer, oligomer or pre-(co)polymer to form the (co)polymer layer overlaying the substrate.

Embodiment Q: The process of Embodiment O and/or P, wherein applying the oxide layer comprises evaporating a metal alkoxide and reacting the metal alkoxide with water to form the oxide layer overlaying the (co)polymer layer overlaying the substrate, or sputter depositing an oxide material to form the oxide layer overlaying the (co)polymer layer overlaying the substrate.

Embodiment R: The process of Embodiment O, P and/or Q, further comprising:

forming a plurality of dyads overlaying the substrate by repeatedly applying the (co)polymer layer to the substrate and applying the oxide layer overlaying the (co)polymer layer to the substrate to create alternating (co)polymer layers and oxide layers between the substrate and the outer (co)polymer layer overlaying the plurality of dyads.

Embodiment S: The process of Embodiment O, P, Q and/or R, further comprising:

depositing an oxide material to form the at least one outer oxide layer overlaying the outer (co)polymer layer, optionally wherein applying the oxide layer comprises evaporating a metal alkoxide and reacting the metal alkoxide with water to form the oxide layer overlaying the (co)polymer layer overlaying the substrate, or sputter depositing an oxide material to form the oxide layer overlaying the (co)polymer layer overlaying the substrate.

Embodiment T: The process of Embodiment O, P, Q, R and/or S, further comprising:

forming an adhesion-promoting layer positioned between at least one of the substrate and the at least one dyad, the (co)polymer layer and the oxide layer of the at least one dyad, the oxide layer and the outer (co)polymer layer, or the outer (co)polymer layer and the oxide layer overlaying the outer (co)polymer layer, optionally wherein the adhesion promoting layer comprises the reaction product of at least one silane compound.

Various aspects and advantages of exemplary embodiments of the disclosure have been summarized. The above Summary is not intended to describe each illustrated embodiment or every implementation of the present certain exemplary embodiments of the present disclosure. The Drawings and the Detailed Description that follow more particularly exemplify certain preferred embodiments using the principles disclosed herein.

BRIEF DESCRIPTION OF THE DRAWINGS

The disclosure may be more completely understood in consideration of the following detailed description of various embodiments of the disclosure in connection with the accompanying figures, in which.

Figure 1:
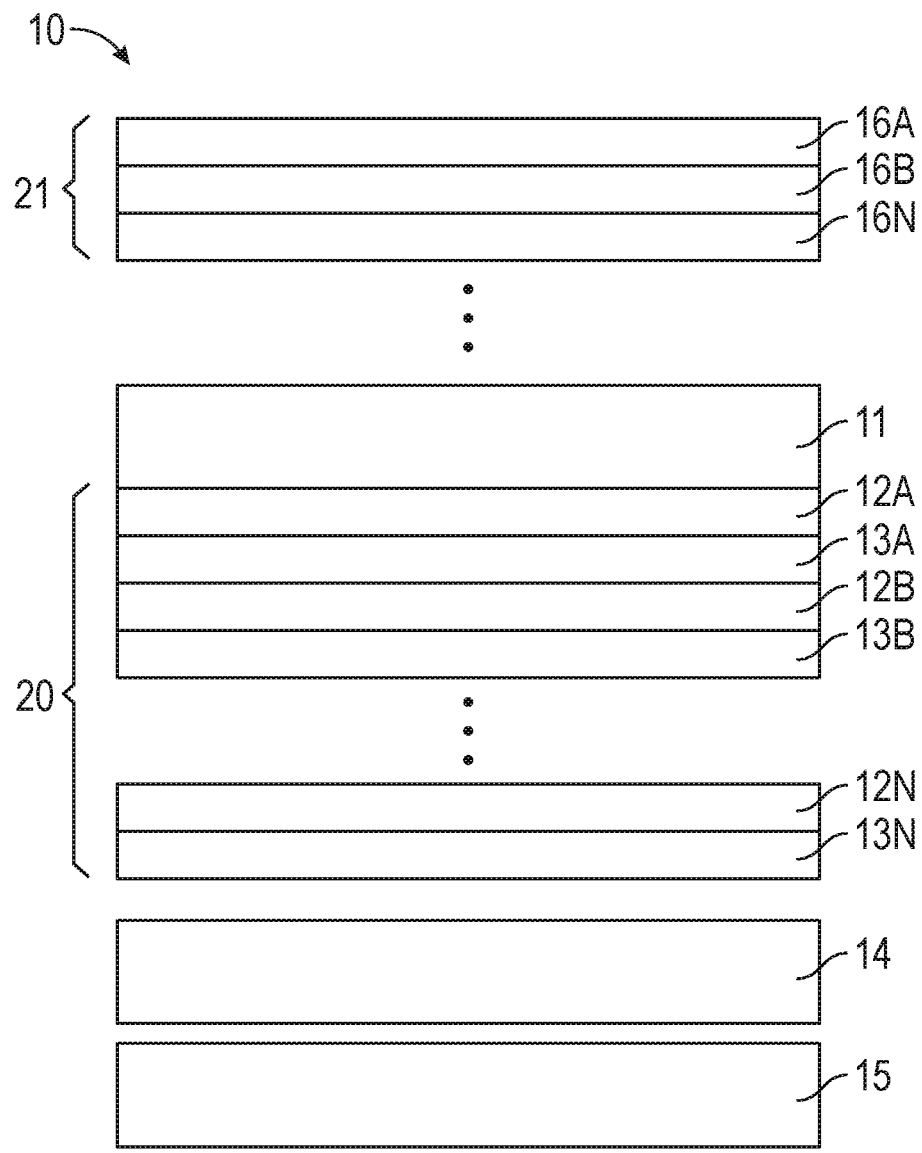
FIG. 1 is a schematic cross-sectional view of an exemplary barrier film according to various exemplary embodiments disclosed herein.

In the drawings, like reference numerals indicate like elements. While the above-identified drawing, which may not be drawn to scale, sets forth various embodiments of the present disclosure, other embodiments are also contemplated, as noted in the Detailed Description. In all cases, this disclosure describes the presently disclosed disclosure by way of representation of exemplary embodiments and not by express limitations. It should be understood that numerous other modifications and embodiments can be devised by those skilled in the art, which fall within the scope and spirit of this disclosure.

DETAILED DESCRIPTION

For the following Glossary of defined terms, these definitions shall be applied for the entire application, unless a different definition is provided in the claims or elsewhere in the specification.

Glossary

Certain terms are used throughout the description and the claims that, while for the most part are well known, may require some explanation. It should understood that:

The term "barrier film" or "barrier layer" refers to a film or layer which is designed to be impervious or resistant to ultraviolet radiation and/or atomic oxygen.

The terms "(co)polymer" or "(co)polymer" includes homo(co)polymers and (co)polymers, as well as
homo(co)polymers or (co)polymers that may be formed in a miscible blend, (e.g., by coextrusion or by reaction, including, (e.g., transesterification. The term "(co)polymer" includes random, block and star (e.g., The term "crosslinker" or "coupling agent" means a compound which provides a chemical bond between two dissimilar materials, usually an inorganic and an organic material. Coupling agents are typically multi-functional molecules or oligomers which can act to effect crosslinking during chemical reactions, for example, a chemical reaction such as free radical (co)polymerization to form a (co) polymer.

The term "crosslinked" (co)polymer refers to a (co) polymer whose (co)polymer chains are joined together by covalent chemical bonds, usually via crosslinking molecules or groups, to form a network (co)polymer. A crosslinked (co)polymer is generally characterized by insolubility but may be swellable in the presence of an appropriate solvent.

The term "cure" refers to a process that causes a chemical change, (e.g., a reaction that creates a covalent bond to solidify a multilayer film layer or increase its viscosity.

The term "cured (co)polymer" includes both crosslinked and uncrosslinked (co)polymers.

The term "metal" includes a pure metal or a metal alloy.

The term "dyad" refers to a pair of layers that includes a (co)polymer layer and an oxide layer overlaying the (co) polymer layer.

The term "film" or "layer" refers to a single stratum within a multilayer film.

A "graphic film" as used herein is any film that absorbs at least some visible or infrared light range and reflects at least some wavelengths of light in the visible range where the reflected light contains some graphical content. The graphical content may include patterns, images, or other visual indicia. The graphic film may be a printed film, or the graphic may be created by means other than printing. For example, the graphic film may be perforated reflective film with a patterned arrangement of perforations. The graphic film may also be created by embossing. In some embodiments, the graphic film is a partially transmissive graphic film.

The term "(meth)acryl" or "(meth)acrylate" with respect to a monomer, oligomer, (co)polymer or compound means a vinyl-functional alkyl ester formed as the reaction product of an alcohol with an acrylic or a methacrylic acid.

The term "optically clear" refers to an article in which there is no visibly noticeable distortion, haze or flaws as detected by the naked eye at a distance of about 1 meter, preferably about 0.5 meters.

The term "optical thickness" when used with respect to a layer refers to the physical thickness of the layer times its in-plane index of refraction.

By using the term "$T_g$", we refer to the glass transition temperature of a cured (co)polymer when evaluated in bulk rather than in a thin film form. In instances where a (co)polymer can only be examined in thin film form, the bulk form $T_g$ can usually be estimated with reasonable accuracy. Bulk form $T_g$ values usually are determined by evaluating the rate of heat flow vs. temperature using differential scanning calorimetry (DSC) to determine the onset of segmental mobility for the (co)polymer and the inflection point (usually a second-order transition) at which the (co)polymer can be said to change from a glassy to a rubbery state. Bulk form $T_g$ values can also be estimated using a dynamic mechanical thermal analysis (DMTA) technique, which measures the change in the modulus of the (co)polymer as a function of temperature and frequency of vibration.

The term "vapor coating" or "vapor depositing" means applying a coating to a substrate surface from a vapor phase, for example, by evaporating and subsequently depositing onto the substrate surface a precursor material to the coating or the coating material itself. Exemplary vapor coating processes include, for example, physical vapor deposition (PVD), chemical vapor deposition (CVD), and combinations thereof.

The term "visible light-transmissive" with respect to a support, layer, assembly, article or device means that the support, layer, assembly or device has an average transmission over the visible portion of the spectrum, $T_{vis}$, of at least about 20%, measured along the normal axis.

The term "contiguous" refers to layers that touch or sharing at least one common boundary.

The term "adjacent to" with reference to a particular layer means joined with or attached to another layer, in a position wherein the two layers are either next to and directly contacting each other (i.e., "adjoining"), or not in direct contact (i.e., there are one or more additional layers intervening between the "adjacent" layers).

By using the term "separated by" to describe the position of an intervening layer with respect to two other surrounding layers, we refer to at least one intervening layer as being between the surrounding layers but not necessarily adjoining or contiguous with either surrounding layer, although the intervening lay may adjoin one or both of the surrounding layers.

By using terms of orientation such as "atop", "on", "over," "covering", "uppermost", "underlying" and the like for the location of various elements in the disclosed coated articles, we refer to the relative position of an element with respect to a horizontally-disposed, upwardly-facing substrate. However, unless otherwise indicated, it is not intended that the substrate or articles should have any particular orientation in space during or after manufacture, or in interpreting the claims.

By using the term "overlaying" or "overcoated" to describe the position of a layer with respect to a substrate, dyad or different layer of a barrier film of the present disclosure, we refer to the layer as being atop the substrate, dyad or different layer, but not necessarily contiguous to or in contact with the substrate, dyad or different layer, although the layer may, in some embodiments, by in direct contact with the substrate, dyad or other layer.

The terms "about" or "approximately" with reference to a numerical value or a shape means+/− five percent of the numerical value or property or characteristic, but expressly includes the exact numerical value. For example, a viscosity of "about" 1 Pa-sec refers to a viscosity from 0.95 to 1.05 Pa-sec but also expressly includes a viscosity of exactly 1 Pa-sec. Similarly, a perimeter that is "substantially square" is intended to describe a geometric shape having four lateral edges in which each lateral edge has a length which is from 95% to 105% of the length of any other lateral edge, but which also includes a geometric shape in which each lateral edge has exactly the same length.

The term "substantially" with reference to a property or characteristic means that the property or characteristic is exhibited to a greater extent than the opposite of that property or characteristic is exhibited. For example, a substrate that is "substantially" transparent refers to a substrate that transmits more radiation (e.g., visible light) than it fails to transmit (e.g., absorbs and reflects). Thus, a substrate that transmits more than 50% of the visible light incident upon its surface is substantially transparent, but a substrate that transmits 50% or less of the visible light incident upon its surface is not substantially transparent.

As used in this specification and the appended embodiments, the singular forms "a", "an", and "the" include plural referents unless the content clearly dictates otherwise. Thus, for example, reference to fine fibers containing "a compound" includes a mixture of two or more compounds. As used in this specification and the appended embodiments, the term "or" is generally employed in its sense including "and/or" unless the content clearly dictates otherwise.

As used in this specification, the recitation of numerical ranges by endpoints includes all numbers subsumed within that range (e.g., 1 to 5 includes 1, 1.5, 2, 2.75, 3, 3.8, 4, and 5).

Unless otherwise indicated, all numbers expressing quantities or ingredients, measurement of properties and so forth used in the specification and embodiments are to be understood as being modified in all instances by the term "about." Accordingly, unless indicated to the contrary, the numerical parameters set forth in the foregoing specification and attached listing of embodiments can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should at least be construed in light of the number of reported significant digits and by applying ordinary rounding techniques.

By definition, the total weight percentages of all ingredients in a composition equals 100 weight percent.

Various exemplary embodiments of the disclosure will now be described. Exemplary embodiments of the present disclosure may take on various modifications and alterations without departing from the spirit and scope of the present disclosure. Accordingly, it is to be understood that the embodiments of the present disclosure are not to be limited to the following described exemplary embodiments but is to be controlled by the limitations set forth in the claims and any equivalents thereof.

UV Radiation and Atomic Oxygen Barrier Films

Referring now to FIG. 1, the present disclosure describes barrier films 10 including a substrate 15 comprised of a (co)polymer, at least one dyad 20 (AA-NN) positioned on the substrate 15 and an outer (co)polymer layer 11 overlaying the at least one dyad 20. The at least one dyad 20 includes a (co)polymer layer 13 (AA-NN) overlaying the substrate and an oxide layer 12 (AA-NN) overlaying the (co)polymer layer 13. Optionally, at least one outer oxide layer 21(A-N) overlays the outer (co)polymer layer 13. The barrier films 10 transmit visible light and transmits, at an incident light angle of at least one of 0°, 30°, 45°, 60°, or 75°, at most 70 percent of incident ultraviolet light in a wavelength range from at least 100 nanometers to 400 nanometers or more preferably in a wavelength range from at least 100 nm to 350 nm. The barrier films 10 also exhibit an atomic oxygen degradation, when tested according to the Atomic Oxygen Degradation Test described herein, of less than $1\times10^{-20}$ mg/atom, $1\times10^{-21}$ mg/atom, or $1\times10^{-22}$ mg/atom.

The barrier films can be subjected to various post-treatments such as heat treatment, UV or vacuum UV(VUV) treatment, or plasma treatment. Heat treatment can be conducted by passing the barrier film through an oven or directly heating the film in the coating apparatus, (e.g., using infrared heaters or heating directly on a drum. Heat treatment may for example be performed at temperatures from about 30° C. to about 200° C., about 35° C. to about 150° C., or about 40° C. to about 70° C.

In further exemplary embodiments, the barrier films 10 of any of the foregoing embodiments may be applied to a major surface of a decorative object, the decorative object further comprising a graphic film, a paint, an ink, a stain, a dye, a lacquer, or a combination thereoef, or an electronic device, the electronic device further comprising a light emitting device, a light receiving device, a photovoltaic device, a thin film transistor or a combination thereof. Optionally, the decorative object or electronic device is a component of a satellite or aircraft, such as a pilotless aerial surveillance aircraft (e.g., a drone).

Substrates

In any of the foregoing embodiments, the substrate 15 is comprised of a (co)polymer. In some exemplary embodiments, the substrate (co)polymer comprises a fluoropolymer, a polyimide (co)polymer, a cyclic olefin (co)polymer, poly(ethylene terephthalate), poly(ethylene naphthalate), poly(methyl methacrylate), polycarbonate, polypropylene, polyethylene, polysulfone, poly(ether sulfone), polyurethane, polyamide, poly(vinyl butyral), poly(vinyl chloride), poly(ethylene sulfide poly(imide benzoxazole) and polybenzoxazole, optionally wherein the fluoropolymer comprises tetrafluoroethylene, hexafluoropropylene, vinylidene fluoride, a perfluoroalkoxy alkane, or a combination thereof.

In certain exemplary embodiments, the fluorinated (co)polymer preferably comprises tetrafluoroethylene, hexafluoropropylene, vinylidene fluoride, a perfluoroalkoxy alkane, or a combination thereof. Suitable fluoropolymer substrates are available under the trade name "TEFLON FEP100" from E. I. DuPont de Nemours, Wilmington, DE, or which "TEFLON FEP100 500A is currently preferred.

In other exemplary embodiments, the polyimide (co)polymer preferably comprises dianhydride and diamine. Suitable polyimide substrates are available under the trade name "KAPTON" from E. I. DuPont de Nemours, Wilmington, DE, or which "KAPTON CS100" is currently preferred.

The smoothness and continuity of the barrier film and the adhesion of subsequently applied layers to the substrate can be enhanced by appropriate optional pretreatment of the substrate or optional application of a priming or seed layer prior to forming the inorganic or hybrid layer. Modification of the surface to create hydroxyl or amine functional groups is particularly desirable. Methods for surface modification are known in the art. In one embodiment, a pretreatment regimen involves electrical discharge pretreatment of the substrate in the presence of a reactive or non-reactive atmosphere (e.g., plasma, glow discharge, corona discharge, dielectric barrier discharge or atmospheric pressure discharge), chemical pretreatment, or flame pretreatment. These pretreatments can help ensure that the surface of the substrate will be receptive to the subsequently applied layers. In one embodiment, the method can include plasma pretreatment. For organic surfaces, plasma pretreatments can include nitrogen or water vapor. Another pretreatment regimen involves coating the substrate with an inorganic or organic base coat layer optionally followed by further pretreatment using plasma or one of the other pretreatments described above.

In another embodiment, optional organic base coat layers, and especially base coat layers based on crosslinked acrylate (co)polymers, may be advantageously employed. The base coat layer can be formed by flash evaporation and vapor deposition of a radiation-crosslinkable monomer (e.g., an acrylate monomer), followed by crosslinking in situ (using, for example, an electron beam apparatus, UV light source, electrical discharge apparatus or other suitable device), as described in U.S. Pat. Nos. 4,696,719, 4,722,515, 4,842,893, 4,954,371, 5,018,048, 5,032,461, 5,097,800, 5,125,138, 5,440,446, 5,547,908, 6,045,864, 6,231,939 and 6,214,422; in published PCT Application No. WO 00/26973; in D. G. Shaw and M. G. Langlois, "A New Vapor Deposition Process for Coating Paper and (co)polymer Webs", 6th International Vacuum Coating Conference (1992); in D. G. Shaw and M. G. Langlois, "A New High Speed Process for Vapor Depositing Acrylate Thin Films: An Update", Society of Vacuum Coaters 36th Annual Technical Conference Proceedings (1993); in D. G. Shaw and M. G. Langlois, "Use of Vapor Deposited Acrylate Coatings to Improve the Barrier Properties of Metallized Film", Society of Vacuum Coaters 37th Annual Technical Conference Proceedings (1994); in D. G. Shaw, M. Roehrig, M. G. Langlois and C. Sheehan, "Use of Evaporated Acrylate Coatings to Smooth the Surface of Polyester and Polypropylene Film Substrates", RadTech (1996); in J. Affinito, P. Martin, M. Gross, C. Coronado and E. Greenwell, "Vacuum deposited (co)polymer/metal multilayer films for optical application", Thin Solid Films 270, 43-48 (1995); and in J. D. Affinito, M. E. Gross, C. A. Coronado, G. L. Graff, E. N. Greenwell and P. M. Martin, "(co)polymer-Oxide Transparent Barrier Layers", Society of Vacuum Coaters 39th Annual Technical Conference Proceedings (1996).

If desired, the base coat can also be applied using conventional coating methods such as roll coating (e.g., gravure roll coating) or spray coating (e.g., electrostatic spray coating), then crosslinked using, for example, heat, UV radiation or an electron beam. The desired chemical composition and thickness of the base coat layer will depend in part on the nature of the substrate. For example, for a PET substrate, the base coat layer can be formed from an acrylate monomer and may for example have a thickness of only a few nm up to about 2 micrometers.

Dyads

The barrier films 10 comprise at least one dyad 20 (AA-NN) positioned on the substrate 15 as described further below. Preferably, the barrier films comprise a plurality of dyads 20, optionally wherein the plurality of dyads 20 is at least or exactly two dyads, three dyads, four dyads, five dyads, or six dyads.

The disclosed barrier films 10 can exhibit superior mechanical properties such as elasticity and flexibility yet still have low atomic oxygen degradation rates. The films have at least one dyad comprising a (co)polymer layer and an oxide layer or hybrid organic/inorganic layer and can have additional inorganic or hybrid organic/inorganic layers. In one embodiment, the disclosed barrier films can have alternating (co)polymer layers and oxide layers. In other exemplary embodiments, the disclosed barrier films can include one or more hybrid organic/inorganic layers.

(Co)polymer Layers

Each (co)polymer layer in the at least one dyad and the outer (co)polymer layer comprises a (co)polymer selected from an olefinic (co)polymer, a (meth)acrylate (co)polymer, a urethane (co)polymer, a fluoropolymer, a silicone (co)polymer, or a combination thereof.

(Co)polymeric layers can be formed from a variety of organic materials or compounds using a variety of processes. The (co)polymeric layer may be crosslinked in situ after it is applied. In one embodiment, the (co)polymeric layer can be formed by flash evaporation, vapor deposition and (co)polymerization of a monomer using, for example, heat, plasma, UV radiation or an electron beam.

Exemplary monomers for use in such a method include volatilizable (meth)acrylate monomers. In a specific embodiment, volatilizable acrylate monomers are employed. Suitable (meth)acrylates will have a molecular weight that is sufficiently low to allow flash evaporation and sufficiently high to permit condensation on the substrate. The organic materials or compounds also can be vaporized using any methods like those described below for vaporizing a metal alkoxide.

If desired, the (co)polymeric layers can alternatively be applied using conventional methods such as plasma deposition, solution coating, extrusion coating, roll coating (e.g., gravure roll coating), or spray coating (e.g., electrostatic spray coating), and if desired crosslinked or (co)polymerized, (e.g., as described above. The desired chemical composition and thickness of the additional layer will depend in part on the nature of the substrate and the desired purpose for the film. Coating efficiency can be improved by cooling the substrate.

Exemplary organic compounds include esters, vinyl compounds, alcohols, carboxylic acids, acid anhydrides, acyl halides, thiols, amines and mixtures thereof. Non-limiting examples of esters include (meth)acrylates, which can be used alone or in combination with other multifunctional or monofunctional (meth)acrylates. Exemplary (meth)acrylates include hexanediol diacrylate, ethoxyethyl acrylate, phenoxyethyl acrylate, cyanoethyl(mono)acrylate, isobornyl acrylate, octadecyl acrylate, isodecyl acrylate, lauryl acrylate, beta-carboxyethyl acrylate, tetrahydrofurfuryl acrylate, dinitrile acrylate, pentafluorophenyl acrylate, nitrophenyl acrylate, 2-phenoxyethyl acrylate, 2,2,2-trifluoromethyl acrylate, diethylene glycol diacrylate, triethylene glycol diacrylate, tripropylene glycol diacrylate, tetraethylene glycol diacrylate, neopentyl glycol diacrylate, propoxylated neopentyl glycol diacrylate, polyethylene glycol diacrylate, tetraethylene glycol diacrylate, bisphenol A epoxy diacrylate, trimethylol propane triacrylate, ethoxylated trimethylol propane triacrylate, propylated trimethylol propane triacrylate, tris(2-hydroxyethyl)-isocyanurate triacrylate, pentaerythritol triacrylate, phenylthioethyl acrylate, naphthloxyethyl acrylate, IRR-214 cyclic diacrylate from UCB Chemicals, epoxy acrylate RDX80095 from Rad-Cure Corporation, the corresponding methacrylates of the acrylates listed above and mixtures thereof. Exemplary vinyl compounds include vinyl ethers, styrene, vinyl naphthylene and acrylonitrile. Exemplary alcohols include hexanediol, naphthalenediol and hydroxyethylmethacrylate. Exemplary carboxylic acids include phthalic acid and terephthalic acid, (meth)acrylic acid). Exemplary acid anhydrides include phthalic anhydride and glutaric anhydride. Exemplary acyl halides include hexanedioyl dichloride, and succinyl dichloride. Exemplary thiols include ethyleneglycol-bisthioglycolate, and phenylthioethylacrylate. Exemplary amines include ethylene diamine and hexane 1,6-diamine.

Oxide Layers

Each of the oxide layers in the at least one dyad and the optional at least one outer oxide layer overlaying the outer (co)polymer layer comprises a metal oxide selected from silicon oxide, silica alumina oxide, gallium oxide, magnesium oxide, niobium oxide, titanium dioxide, yttrium oxide, zinc oxide, tin oxide, nickel oxide, aluminum doped zinc oxide, indium tin oxide, zirconium oxynitride, hafnia, alumina, alumina doped silica, lanthanum fluoride, neodymium fluoride, aluminum fluoride, magnesium fluoride, calcium fluoride, or a combination thereof.

Outer (Co)Polymer Layer Overlaying the Dyads

An outer (co)polymer layer 11 overlays the at least one dyad ( ) which may be a plurality of dyads 20. The outer (co)polymer layer is preferably crosslinked.

In some exemplary embodiments, the outer (co)polymer layer comprises an olefinic (co)polymer selected from low density polyethylene, linear low density polyethylene, ethylene vinyl acetate, polyethylene methyl acrylate, polyethylene octene, polyethylene propylene, polyethylene butene, polyethylene maleic anhydride, polymethyl pentene, polyisobutene, polyisobutylene, polyethylene propylene diene, cyclic olefin (co)polymers, and blends thereof.

In certain exemplary embodiments, the at least one (co)polymer layer in the at least one dyad or the outer (co)polymer layer further comprises an ultraviolet radiation absorber, a hindered amine light stabilizer, an antioxidant, or a combination thereof.

The ultraviolet radiation absorber is preferably selected from a benzotriazole compound, a benzophenone compound, a triazine compound, or a combination thereof.

Presently preferred hindered amine light stabilizers are available from BASF U.S.A (Florham Park, NJ) under the trade name "TINUVIN". The hindered amine light stabilizer is preferably selected from TINUVIN 123, TINUVIN 144, TINUVIN 292 or a combination thereof.

Presently preferred anti-oxidants are available from BASF under the trade name "IRGANOX" and "IRGAFOS". Suitable antioxidants for polyolefins are preferably selected from IRGANOX 1010, IRGANOX 1076, IRGAFOS 168 or a combination thereof.

The outer (co)polymer layer 14 overlaying the at least one dyad 20 or the barrier film 10 may advantageously comprise at least one of an optional protective layer, a multilayer optical film, an ultraviolet light shielding mirror film, a heat sealable encapsulating film, or a combination thereof as described further below.

Optional Protective Layers

Other functional layers or coatings can be added to the barrier film include an optional layer or layers to make the film more rigid. The uppermost layer of the film is optionally a suitable protective layer. If desired, the protective layer can be applied using conventional coating methods such as roll coating (e.g., gravure roll coating) or spray coating (e.g., electrostatic spray coating), then crosslinked using, for example, UV radiation. The optional protective layer can also be formed by flash evaporation, vapor deposition and crosslinking of a monomer as described above. Volatilizable (meth)acrylate monomers are suitable for use in such a protective layer. In a specific embodiment, volatilizable acrylate monomers are employed.

Optional Multilayer Optical Films

The barrier film 10 and preferably the outer (co)polymer layer 11 may optionally comprise a multilayer optical film. In general, optional multilayer optical films described herein comprise at least 3 layers (typically in a range from 3 to 2000 total layers or more).

Multilayer optical films described herein can be made using general processing techniques, such as those described in U.S. Pat. No. 6,783,349 (Neavin et al.), the entire disclosure of which is incorporated herein by reference in its entirety.

Optional multilayer optical films described herein comprise at least a plurality of alternating first and second optical layers collectively reflecting at an incident light angle of at least one of 0°, 30°, 45°, 60°, or 75°, at least 30 (in some embodiments, at least 40, 45, 50, 55, 60, 65, 70, 75, 80, 85, or even at least 90) percent of incident ultraviolet (UV) light (i.e., any light having a wavelength in a range from 100 to less than 400 nm) over at least a 30-nanometer wavelength reflection bandwidth in a wavelength range from at least 100 to 350 (in some embodiments, at least 180 to 350, or even at least 200 to 350) nm. In some embodiments, the multilayer optical film has a UV reflectivity (Reflectance) greater than 90% (in some embodiments, greater than 99%), at least one of 222 nm, 254 nm, 265 nm, or 275 nm.

In some embodiments, multilayer optical films described herein have a UV transmission band edge in a range from 10 to 90 percent transmission spanning less than 20 (in some embodiments, less than 15, or even less than 10) nanometers.

Optional Ultraviolet Light Shielding Mirror Films

The barrier film 10 and preferably the outer (co)polymer layer 11 may optionally comprise an ultraviolet light shielding mirror film (not shown in FIG. 1) comprising a fluoropolymer substrate, a multilayer ultraviolet light shielding mirror film (e.g., a UV-C mirror film) disposed on a major surface of the substrate, and optionally a heat-sealable encapsulant layer disposed on a major surface of the multilayer ultraviolet light shielding mirror film opposite the fluoropolymer substrate. The multilayer ultraviolet light shielding mirror film is preferably comprised of first optical layers and second optical layer.

In some exemplary embodiments of optional multilayer ultraviolet light shielding mirror films, an optional protective film, preferably comprised of a fluoropolymer (co)polymer, is disposed on a major surface of the heat-sealable encapsulant layer opposite the multilayer ultraviolet light shielding mirror film. In some such embodiments, an adhesive encapsulant can be coated onto or coextruded with a fluoropolymer (co)polymer, preferably having a melting point greater than 150° C., to protect adhesive encapsulants such as polyolefin (co)polymers that are less UV-C stable, but which are lighter and less expensive. Silicone adhesive encapsulants are also contemplated as a useful embodiment of this invention.

In any of the foregoing embodiments of optional multilayer ultraviolet light shielding mirror films, the at least first optical layer comprises at least one polyethylene (co)polymer, and wherein the second optical layer comprises at least one fluoropolymer selected from a tetrafluoroethylene (co) polymer, a hexafluoropropylene (co)polymer, a vinylidene fluoride (co)polymer, a hexafluoropropylene (co)polymer, a perfluoroalkoxy alkane (co)polymer, or a combination thereof. In some such embodiments, the at least one fluoropolymer is crosslinked.

In some embodiments of optional multilayer ultraviolet light shielding mirror films described herein, the at least first optical layer comprises (co)polymeric material (e.g., at least one of polyvinylidene fluoride (PVDF), ethylene tetrafluoroethylene (ETFE)), and wherein the second optical layer comprises (co)polymeric material (e.g., at least one of a (co)polymer (THV,) or a polyethylene (co)polymer comprising subunits derived from tetrafluoroethylene (TFE), hexafluoropropylene (HFP), and vinylidene fluoride (VDF), a (co)polymer (FEP) comprising subunits derived from tetrafluoroethylene (TFE) and hexafluoropropylene (HFP), or perfluoroalkoxy alkane (PFA)).

Exemplary materials for making the optical layers that reflect blue light (e.g., the first and second optical layers) include (co)polymers (e.g., polyesters, (co)polyesters, and modified (co)polyesters). In this context, the term "(co) polymer" will be understood to include homo(co)polymers and (co)polymers, as well as (co)polymers or (co)polymers that may be formed in a miscible blend, for example, by co-extrusion or by reaction, including transesterification. The terms "(co)polymer" and "(co)polymer" include both random and block (co)polymers.

Polyesters suitable for use in some exemplary of multilayer ultraviolet light shielding mirror films constructed according to the present disclosure generally include dicarboxylate ester and glycol subunits and can be generated by reactions of carboxylate monomer molecules with glycol monomer molecules. Each dicarboxylate ester monomer molecule has two or more carboxylic acid or ester functional groups and each glycol monomer molecule has at least two hydroxy functional groups. The dicarboxylate ester monomer molecules may all be the same or there may be two or more different types of molecules. The same applies to the glycol monomer molecules. Also included within the term "polyester" are polycarbonates derived from the reaction of glycol monomer molecules with esters of carbonic acid.

Examples of suitable dicarboxylic acid monomer molecules for use in forming the carboxylate subunits of the polyester layers include 2,6-naphthalene dicarboxylic acid and isomers thereof; terephthalic acid; isophthalic acid; phthalic acid; azelaic acid; adipic acid; sebacic acid; norbornanedicarboxylic acid; bi-cyclo-octane dicarboxylic acid; 1,4-cyclohexanedicarboxylic acid and isomers thereof, t-butylisophthalic acid, trimellitic acid, sodium sulfonated isophthalic acid; 4,4'-biphenyl dicarboxylic acid and isomers thereof, and lower alkyl esters of these acids, such as methyl or ethyl esters. The term "lower alkyl" refers, in this context, to $C_1$-$C_{10}$ straight-chain or branched alkyl groups.

Examples of suitable glycol monomer molecules for use in forming glycol subunits of the polyester layers include ethylene glycol; propylene glycol; 1,4-butanediol and isomers thereof; 1,6-hexanediol; neopentyl glycol; polyethylene glycol; diethylene glycol; tricyclodecanediol; 1,4-cyclohexanedimethanol and isomers thereof, norbornanediol; bicyclooctanediol; trimethylolpropane; pentaerythritol; 1,4-benzenedimethanol and isomers thereof, Bisphenol A; 1,8-dihydroxybiphenyl and isomers thereof, and 1,3-bis(2-hydroxyethoxy)benzene.

Another exemplary birefringent (co)polymer useful for the reflective layer(s) is polyethylene terephthalate (PET), which can be made, for example, by reaction of terephthalic dicarboxylic acid with ethylene glycol. Its refractive index for polarized incident light of 550 nm wavelength increases when the plane of polarization is parallel to the stretch direction from about 1.57 to as high as about 1.69. Increasing molecular orientation increases the birefringence of PET. The molecular orientation may be increased by stretching the material to greater stretch ratios and holding other stretching conditions fixed. Co(co)polymers of PET (Co-PET), such as those described in U.S. Pat. No. 6,744,561 (Condo et al.) and U.S. Pat. No. 6,449,093 (Hebrink et al.), the disclosures of which are incorporated herein by reference, are particularly useful for their relatively low temperature (typically less than 250° C.) processing capability making them more coextrusion compatible with less thermally stable second (co)polymers. Other semicrystalline polyesters suitable as birefringent (co)polymers include polybutylene terephthalate (PBT), and (co)polymers thereof such as those described in U.S. Pat. No. 6,449,093 (Hebrink et al.) and U.S. Pat. Pub. No. 2006/0084780 (Hebrink et al.), the disclosures of which are incorporated herein by reference. Another useful birefringent (co)polymer is syndiotactic polystyrene (sPS).

First optical layers can also be isotropic high refractive index layers comprising at least one of poly(methyl methacrylate), (co)polymers of polypropylene; (co)polymers of polyethylene, cyclic olefin (co)polymers, cyclic olefin block (co)polymers, polyurethanes, polystyrenes, isotactic polystyrene, atactic polystyrene, (co)polymers of polystyrene (e.g., (co)polymers of styrene and acrylate), polycarbonates, (co)polymers of polycarbonates, miscible blends of polycarbonates and (co)polyesters, or miscible blends of poly (methyl methacrylate) or poly(vinylidene fluoride.

Second optical layers can also comprise fluorinated (co) polymers materials such as at least one of fluorinated ethylene propylene (co)polymer (FEP); (co)polymers of tetrafluorethylene, hexafluoropropylene, and vinylidene fluoride (THV); (co)polymers of tetrafluoroethylene, hexafluoropropylene, or ethylene. Particularly useful are melt processible (co)polymers of tetrafluoroethylene and at least two, or even at least three, additional different comonomers.

Exemplary melt processible (co)polymers of tetrafluoroethylene and other monomers discussed above include those available as (co)polymers of tetrafluoroethylene, hexafluoropropylene, and vinylidene fluoride under the trade designations "DYNEON THV 221," "DYNEON THV 230," "DYNEON THV 2030," "DYNEON THV 340GZ", "DYNEON THV 500," "DYNEON THV 610," and "DYNEON THV 815" from Dyneon LLC (Oakdale, MN); "NEOFLON EFEP" from Daikin Industries, Ltd. (Osaka, Japan); "AFLAS" from Asahi Glass Co., Ltd. (Tokyo, Japan); and (co)polymers of ethylene and tetrafluoroethylene available under the trade designations "DYNEON ET 6210A" and "DYNEON ET 6235" from Dyneon LLC (Oakdale, MN); "TEFZEL ETFE" from E.I. duPont de Nemours and Co. (Wilmington, DE); and "FLUON ETFE" by Asahi Glass Co., Ltd (Tokyo, Japan).

In addition, the second (co)polymer can be formed from homo(co)polymers and (co)polymers of polyesters, polycarbonates, fluoropolymers, polyacrylates, and polydimethylsiloxanes, and blends thereof.

Other exemplary (co)polymers, for the optical layers, especially for use in the second layer, include homo(co) polymers of polymethylmethacrylate (PMMA), such as those available, for example, from Ineos Acrylics, Inc. (Wilmington, DE) under the trade designations "CP71" and "CP80;" and polyethyl methacrylate (PEMA), which has a lower glass transition temperature than PMMA. Additional useful (co)polymers include (co)polymers of PMMA (CoPMMA), such as a CoPMMA made from 75 wt. % methylmethacrylate (MMA) monomers and 25 wt. % ethyl acrylate (EA) monomers, (available, for example, from Ineos Acrylics, Inc. (London, England) under the trade designation "PERSPEX CP63" or Arkema Corp., (Philadelphia, PA) under the trade designation "ATOGLAS 510"), a CoPMMA formed with MMA comonomer units and n-butyl methacrylate (nBMA) comonomer units, or a blend of PMMA and poly(vinylidene fluoride) (PVDF).

Additional suitable (co)polymers for the optical layers include polyolefin (co)polymers such as poly(ethylene-co-octene) (PE-PO) available, for example, under the trade designation "ENGAGE 8200" from Dow Elastomers, Inc. (Midland, MI) and polyethylene methyl acrylate also available, for example, under the trade designation "ELVALOY 1125" from Dow Elastomers, Inc. (Midland, MI); poly (propylene-co-ethylene) (PPPE) available, for example, under the trade designation "Z9470" from Atofina Petrochemicals, Inc. (Houston, TX); and a (co)polymer of atactic polypropylene (aPP) and isotatctic polypropylene (iPP). The multilayer optical films can also include in the second layers, a functionalized polyolefin (e.g., linear low-density polyethylene-graft-maleic anhydride (LLDPE-g-MA) such as that available, for example, under the trade designation "BYNEL 4105" from E.I. duPont de Nemours & Co., Inc. Wilmington, DE).

The selection of the (co)polymer combinations used in creating the of multilayer ultraviolet light shielding mirror films depends, for example, upon the desired bandwidth that will be reflected. Higher refractive index differences between the first optical layer (co)polymer and the second optical layer (co)polymer create more optical power thus enabling more reflective bandwidth. Alternatively, additional layers may be employed to provide more optical power. Exemplary combinations of birefringent layers and second (co)polymer layers may include, for example, the following: PET/THV, PET/Silicone Poloxamide (SPOX), PET/CoPMMA, CoPEN/PMMA, CoPEN/SPOX, sPS/SPOX, sPS/THV, CoPEN/THV, PET/blend of PVDF/PMMA, PET/fluoropolymers, sPS/fluoroelastomers, and CoPEN/fluoropolymers.

Exemplary material combinations for making the optical layers that reflect UV light (e.g., the first and second optical layers) include PMMA (e.g., first optical layers)/THV (e.g., second optical layers), PMMA (e.g., first optical layers)/blend ofPVDF/PMMA (e.g., second optical layers), PC (polycarbonate) (e.g., first optical layers)/PMMA (e.g., second optical layers), PC(polycarbonate) (e.g., first optical layers)/blend of PMMA/PVDF (e.g., second optical layers), copolyethylene (e.g., polyethylene methyl acrylate) (e.g., first optical layers)/THV (e.g., second optical layers), EVA (e.g., first optical layers)/THV (e.g., second optical layers), COC (e.g., first optical layers)/THV (e.g., second optical layers), blend of PMMA/PVDF (e.g., first optical layers)/ blend ofPVDF/PMMA (e.g., second optical layers) and PET (e.g., first optical layers)/CoPMMA (e.g., second optical layers).

In some embodiments, the first optical layer is a fluoropolymer and the second optical layer is a fluoropolymer. Examples of the materials that are desirable for such embodiments include ETFE/THV, PMMA/THV, PVDF/FEP, ETFE/FEP, PVDF/PFA, and ETFE/PFA. In one exemplary embodiment, THV available, for example, under the trade designation "DYNEON THV 221 GRADE" or "DYNEON THV 2030 GRADE" or "DYNEON THV 815 GRADE" from Dyneon LLC (Oakdale, MN), are employed as the second optical layer with PMMA as the first optical layer for multilayer UV-C reflecting mirrors reflecting 300-

400 nm. In another exemplary embodiment, THV, available, for example, under the trade designation "DYNEON THV 221 GRADE" or "DYNEON THV 2030 GRADE" or "DYNEON THV 815 GRADE" from Dyneon LLC (Oakdale, MN) are employed as the second optical layer, preferably in combination with "ELVALOY 1125" available from Dow Elastomers, Inc. (Midland, MI) as the first optical layer.

Exemplary material for making the optical layers that absorb UV light, or blue light, include polyolefin (co)polymers, COC, EVA, TPU, PC, PMMA, CoPMMA, siloxane (co)polymers, fluoropolymers, THV, PET, PVDF or blends of PMMA and PVDF.

A UV absorbing layer (e.g., a UV protective layer) aids in protecting the visible/IR-reflective optical layer stack from UV-light caused damage/degradation over time by absorbing UV-light (e.g., any UV-light) that may pass through the UV-reflective optical layer stack. In general, the UV-absorbing layer(s) may include any (co)polymeric composition (i.e., (co)polymer plus additives), including pressure-sensitive adhesive compositions, that is capable of withstanding UV-light for an extended period of time.

LED UV light, in particular the ultraviolet radiation from 280 to 400 nm, can induce degradation of plastics, which in turn results in color change and deterioration of optical and mechanical properties. Inhibition of photo-oxidative degradation is important for outdoor applications wherein long-term durability is mandatory. The absorption of UV-light by polyethylene terephthalates, for example, starts at around 360 nm, increases markedly below 320 nm, and is very pronounced at below 300 nm. Polyethylene naphthalates strongly absorb UV-light in the 310 to 370 nm range, with an absorption tail extending to about 410 nm, and with absorption maxima occurring at 352 nm and 337 nm. Chain cleavage occurs in the presence of oxygen, and the predominant photooxidation products are carbon monoxide, carbon dioxide, and carboxylic acids. Besides the direct photolysis of the ester groups, consideration has to be given to oxidation reactions, which likewise form carbon dioxide via peroxide radicals.

A UV absorbing layer may protect the multilayer optical film by reflecting UV light, absorbing UV light, scattering UV light, or a combination thereof. In general, a UV absorbing layer may include any (co)polymer composition that is capable of withstanding UV radiation for an extended period of time while either reflecting, scattering, or absorbing UV radiation. Examples of such (co)polymers include PMMA, CoPMMA, silicone thermoplastics, fluoropolymers, and their (co)polymers, and blends thereof. An exemplary UV absorbing layer comprises PMMA/PVDF blends.

In some embodiments of optional multilayer ultraviolet light shielding mirror films described herein, the at least first optical layer comprises inorganic material (e.g., at least one of zirconium oxynitride, hafnia, alumina, magnesium oxide, yttrium oxide, lanthanum fluoride, or neodymium fluoride,), and wherein the second optical layer comprises inorganic material (e.g., at least one of silica, aluminum fluoride, magnesium fluoride, calcium fluoride, silica alumina oxide or alumina doped silica). Exemplary materials are available, for example, from Materion Corporation (Mayfield Heights, OH), and Umicore Corporation (Brussels, Belgium).

In any of the foregoing embodiments of optional multilayer ultraviolet light shielding mirror films, incident visible light transmission through at least the plurality of alternating first and second optical layers is greater than 30 percent over at least a 30-nanometer wavelength reflection bandwidth in a wavelength range from at least 400 nanometers to 750 nanometers.

In any of the foregoing embodiments of multilayer ultraviolet light shielding mirror films, the at least first optical layer comprises at least one of titania, zirconia, zirconium oxynitride, hafnia, or alumina, and wherein the second optical layer comprises at least one of silica, aluminum fluoride, or magnesium fluoride.

Optional Heat-Sealable Encapsulant Layers

In any of the foregoing embodiments of optional multilayer ultraviolet light shielding mirror films, the optional multilayer ultraviolet light shielding mirror films may comprise an optional heat-sealable encapsulant layer. The optional heat-sealable encapsulant layer comprises a (co)polymer. In any of the foregoing embodiments of optional heat-sealable encapsulant layers, the (co)polymer is selected from an olefinic (co)polymer, a (meth)acrylate (co)polymer, a urethane (co)polymer, a fluoropolymer, a silicone (co)polymer, or a combination thereof.

In certain such embodiments, the (co)polymer is an olefinic (co)polymer selected from low density polyethylene, linear low density polyethylene, ethylene vinyl acetate, polyethylene methyl acrylate, polyethylene octene, polyethylene propylene, polyethylene butene, polyethylene maleic anhydride, polymethyl pentene, polyisobutene, polyisobutylene, polyethylene propylene diene, cyclic olefin (co)polymers, and blends thereof.

In some of the foregoing embodiments of optional heat-sealable encapsulant layers, the (co)polymer has a melting temperature less than 160° C. In certain such embodiments, the (co)polymer is crosslinked. In some such embodiments, the (co)polymer further comprises an ultraviolet radiation absorber, a hindered amine light stabilizer, an antioxidant, or a combination thereof. In further such embodiments, the ultraviolet radiation absorber is selected from a benzotriazole compound, a benzophenone compound, a triazine compound, or a combination thereof.

One exemplary heat sealable fluoropolymer encapsulant material is available from Dyneon LLC (Oakdale, MN) as THV221GZ. Another exemplary heat sealable fluoropolymer encapsulant material is available from 3M Dyneon LLC (Oakdale, MN) as THV340GZ. Other exemplary heat sealable encapsulants for photovoltaic modules can also be found in patent applications WO2013066459A1 (Rasal et. al.) and WO2013066460A1 (Rasal et. al.), the entire disclosures of which are incorporated herein by reference.

The optional heat sealable encapsulant layer can be cross-linked with photo initiators or thermal initiators during or after lamination to a photovoltaic cell. Exemplary photo initiators include benzophones, ortho-methoxy benzophone, para-ethoxy benzophenone, acetophenones, ortho-methoxy-acetophenone, hexaphenones, polymethylvinyl ketone, polyvinylaryl ketones, oligo (2-hydroxy-2-methyl-1-4(1-methylvinyl) propanone, and 2-hydroxy-2-methyl-1-phenyl propan-1-one such as Escacure KIP150 available from Arkema Sartomer Exton, PA). The heat sealable encapsulant layer may be cured with cross-linking through radiation such as using X-ray irradiation, gamma radiation, ultraviolet electromagnetic radiation, and electron beam irradiation.

Cross-linking may also be facilitated with thermal chemical cross-linking agents including; peroxides, amines, silanes, and sulfur containing compounds. Exemplary organic peroxide cross-linking agents include 2,7-dimethyl-2,7-di(t-butylperoxy) octadiyne-3,5 and 2,7-dimethyl-2,7-di (peroxy ethyl carbonate) octadiyne-3,5. Another exemplary cross-linking agent is dicumyl peroxide available from Elf Atochem North America (St. Louis, MO) as Luperox 500R.

Optional Additives

The barrier film 10 and preferably the outer (co)polymer layer 11 and optional heat sealable encapsulant layers optionally may advantageously include UV absorbers, hindered amine light stabilizers, and antioxidants. Benzotriazole, benzophenone, and triazine UV absorbers are available from BASF U.S.A. (Florham Park, NJ) under the tradenames TINUVIN and CHEMISORB such as TINUVIN P, TINUVIN 326, TINUVIN 327, TINUVIN 360, TINUVIN 477, TINUVIN 479, TINUVIN 1577, and TINUVIN 1600. Suitable hindered amine light stabilizers are also available from BASF as TINUVIN 123, TINUVIN 144, and TINUVIN 292.

Exemplary antioxidants are also available from BASF (Florham Park, NJ) under the tradenames IRGANOX, IRGAFOS, AND IRGASTAB. Exemplary antioxidants for polyolefins include IRGANOX 1010, IRGANOX 1076, AND IRGAFOS 168. Additional olefin (co)polymer stabilizers are available from Solvay under the tradenames CYTEC, CYASORB, CYANOX and CYNERGY such as CYASORB THT460, CYASORB UV3529, CYNERGY 400, and CYANOX 2777.

A variety of optional additives may be incorporated into an optical layer to make it UV absorbing. Examples of such additives include at least one of an ultraviolet absorber(s), a hindered amine light stabilizer(s), or an antioxidant(s).

Particularly desirable UV absorbers are red shifted UV Absorbers (RUVA) which absorb at least 70% (in some embodiments, at least 80%, or even greater than 90%) of the UV light in the wavelength region from 180 nm to 400 nm. Typically, it is desirable if the RUVA is highly soluble in (co)polymers, highly absorptive, photo-permanent and thermally stable in the temperature range from 200° C. to 300° C. for extrusion process to form the protective layer. The RUVA can also be highly suitable if they can be (co)polymerizable with monomers to form protective coating layer by UV curing, gamma ray curing, e-beam curing, or thermal curing processes.

RUVAs typically have enhanced spectral coverage in the long-wave UV region, enabling it to block the high wavelength UV light that can cause yellowing in polyesters. Typical UV protective layers have thicknesses in a range from 13 micrometers to 380 micrometers (0.5 mil to 15 mils) with a RUVA loading level of 2-10 wt. %. One of the most effective RUVA is a benzotriazole compound, 5-trifluoromethyl-2-(2-hydroxy-3-alpha-cumyl-5-tert-octylphenyl)-2H-benzotriazole (available under the trade designation "CGL-0139" from BASF (Florham Park, NJ).

Other exemplary benzotriazoles include 2-(2-hydroxy-3,5-di-alpha-cumylphehyl)-2H-benzotriazole, 5-chloro-2-(2-hydroxy-3-tert-butyl-5-methylphenyl)-2H-benzotiazole, 5-chloro-2-(2-hydroxy-3,5-di-tert-butylphenyl)-2H-benzotriazole, 2-(2-hydroxy-3,5-di-tert-amylphenyl)-2H-benzotriazole, 2-(2-hydroxy-3-alpha-cumyl-5-tert-octylphenyl)-2H-benzotriazole, 2-(3-tert-butyl-2-hydroxy-5-methylphenyl)-5-chloro-2H-benzotriazole. Further exemplary RUVAs includes 2(-4,6-diphenyl-1-3,5-triazin-2-yl)-5-hexyloxy-phenol.

Other exemplary UV absorbers include those available from BASF (Florham Park, NJ) under the trade designations "TINUVIN 1577," "TINUVIN 900," "TINUVIN 1600," and "TINUVIN 777." Additional exemplary UV absorbers are available, for example, in a polyester master batch under the trade designation "TA07-07 MB" from Sukano (co) polymers Corporation (Dunkin, SC).

An exemplary UV absorber for polymethylmethacrylate is a masterbatch available, for example, under the trade designation "TA11-10 MBO1" from Sukano (co)polymers Corporation (Dunkin, SC).

An exemplary UV absorber for polycarbonate is a masterbatch from Sukano (co)polymers Corporation, under the trade designations "TA28-09 MBO1." In addition, the UV absorbers can be used in combination with hindered amine light stabilizers (HALS) and antioxidants. Exemplary HALS include those available from BASF, under the trade designation "CHIMASSORB 944" and "TINUVIN 123." Exemplary antioxidants include those obtained under the trade designations "IRGANOX 1010" and "ULTRANOX 626", also available from BASF (Florham Park, NJ).

Other additives may be included in an UV absorbing layer (e.g., a UV protective layer). Small particle non-pigmentary zinc oxide and titanium oxide can also be used as blocking or scattering additives in a UV absorbing layer. For example, nano-scale particles can be dispersed in (co)polymer or coating substrates to minimize UV radiation degradation. The nano-scale particles are transparent to visible light while either scattering or absorbing harmful UV radiation thereby reducing damage to thermoplastics.

U.S. Pat. No. 5,504,134 (Palmer et al.), the entire disclosure of which is incorporated herein by reference, describes attenuation of (co)polymer substrate degradation due to ultraviolet radiation through the use of metal oxide particles in a size range of about 0.001 to about 0.2 micrometer (in some embodiments, about 0.01 micrometer to about 0.15) micrometer in diameter.

U.S. Pat. No. 5,876,688 (Laundon), the entire disclosure of which is incorporated herein by reference, describes a method for producing micronized zinc oxide particulates that are small enough to be transparent when incorporated as UV blocking and/or scattering agents in paints, coatings, finishes, plastic articles, cosmetics and the like which are well suited for use in the present invention. These fine particles such as zinc oxide and titanium oxide with particle size ranged from 10 nm-100 nm that can attenuate UV radiation are available, for example, from Kobo Products, Inc. (South Plainfield, NJ). Flame retardants may also be incorporated as an additive in a UV protective layer.

In addition to adding UV absorbers, HALS, nano-scale particles, flame retardants, antimicrobials, wetting agents, and antioxidants to a UV absorbing layer, the UV absorbers, HALS, nano-scale particles, flame retardants, and antioxidants can be added to the multilayer optical films, and any optional durable top coat layers.

Fluorescing molecules and optical brighteners can also be added to a UV absorbing layer, the multilayer optical layers, an optional hardcoat layer, or a combination thereof. Blue light absorbing dyes or pigments are available, for example, from Clariant Specialty Chemicals (Charlotte, NC) under the trade designation "PV FAST YELLOW," and can be added to the skin layers or top coat. In an exemplary embodiment, antimicrobial agents, and wetting agents, can be added to the skin layer and they would migrate to the surface exposed to the air. A wetting agent may be necessary to prevent condensation fogging.

The desired thickness of a UV protective layer 15 is typically dependent upon an optical density target at specific wavelengths as calculated by Beers Law. In some embodiments, the UV protective layer has an optical density greater than 3.5, 3.8, or 4 at 380 nm, greater than 1.7 at 390 nm, and greater than 0.5 nm at 400 nm. Those of ordinary skill in the art recognize that the optical densities typically should remain fairly constant over the extended life of the article in order to provide the intended protective function.

The optional UV protective layer and any optional additives may be selected to achieve the desired protective functions such as UV protection. Those of ordinary skill in the art recognize that there are multiple means for achieving the noted objectives of the UV protective layer. For example, additives that are very soluble in certain (co)polymers may be added to the composition.

Of particular importance, is the permanence of the additives in the (co)polymer. The additives should not degrade or migrate out of the (co)polymer. Additionally, the thickness of the layer may be varied to achieve desired protective results. For example, thicker UV protective layers would enable the same UV absorbance level with lower concentrations of UV absorbers, and would provide more UV absorber permanence attributed to less driving force for UV absorber migration.

One mechanism for detecting the change in physical characteristics is the use of the weathering cycle described in ASTM G155-05a (October 2005) and a D65 light source operated in the reflected mode. Under the noted test, and when the UV protective layer is applied to the article, the article should withstand an exposure of at least 18,700 kJ/m2 at 340 nm before the b* value obtained using the CIE L*a*b* space increases by 5 or less, 4 or less, 3 or less, or 2 or less before the onset of significant cracking, peeling, delamination, or haze.

An exemplary UV-C protective layer is a cross-linked fluoropolymer. The fluoropolymer may be cross-linked with electron beam irradiation. The cross-linked fluoropolymer layer can have a cross-link density gradient with a high cross-link density at its first surface and a lower cross-link at its second surface. Cross-link density gradients can be achieved low electron beam voltages in the range from 50 kV to 150 kV.

Another exemplary UV-C protective layer is a cross-linked silicone (co)polymer. The cross-linked silicone (co)polymer can also comprise nano-silica particles and silsequioxane particles. An exemplary cross-linked silicone (co)polymer coating comprising nano-silica particles is available under the trade designation "GENTOO" from Ulta-Tech International, Inc. (Jacksonville, FL).

Exemplary UV-C multilayer optical films and UV-C shielding films described herein are preferably flexible. Flexible UV-C multilayer optical films and UV-C shields can be wrapped around a rod not greater than 1 m (in some embodiments, not greater than 75 cm, 50 cm, 25 cm, 10 cm, 5 cm, or even not greater than 1 cm) in diameter without visibly cracking.

Optional Outer Oxide Layers Overlaying the Outer (Co) Polymer Layer

In some exemplary embodiments, the barrier film advantageously comprises at least one outer oxide layer, preferably a metal oxide layer, overlaying the outer (co)polymer layer. In some exemplary embodiments, the at least one outer oxide layer overlaying the outer (co)polymer layer comprises at least one layer comprised of hafnia, zirconium oxynitride, silicon oxide, gallium oxide, indium tin oxide, niobium oxide, titanium dioxide, zinc oxide, tin oxide, nickel oxide, silica alumina oxide, aluminum doped zinc oxide, or a combination thereof. In certain such embodiments, the barrier film exhibits a static decay time, when tested according to the Static Decay Time Test, of less than 90 minutes, 70 minutes, 60 minutes, 50 minutes, 40 minutes, 30 minutes, 20 minutes, 10 minutes or even less than 1 minute.

In certain exemplary embodiments, the at least one outer oxide layer advantageously comprises a plurality of outer oxide layers comprised of hafnia, zirconium oxynitride, silicon oxide, gallium oxide, indium tin oxide, tin oxide, nickel oxide, silica alumina oxide, niobium oxide, titanium dioxide, zinc oxide, aluminum doped zinc oxide, or a combination thereof and a top layer comprised of silicon oxide.

In some exemplary embodiments, any of the oxide layers advantageously may be formed by hydrolysis of a metal alkoxide as described further below. Suitable metal alkoxides for forming a layer on a substrate are compounds that can be volatilized and condensed on the substrate. After condensation the alkoxides may be cured via reaction with water to form a barrier film. Exemplary metal alkoxide compounds can have the general formula $R^1_xM-(OR^2)_{y-x}$ where each $R^1$ is independently $C_1$-$C_{20}$ alkyl, $(C_3$-$C_8)$cycloalkyl, $(C_2$-$C_7)$heterocycle, $(C_2$-$C_7)$heterocycle$(C_1$-$C_8)$alkylene-, $(C_6$-$C_{10})$aryl, $(C_6$-$C_{10})$aryl$(C_1$-$C_8)$alkylene-, $(C_5$-$C_9)$heteroaryl, or $(C_5$-$C_9)$heteroaryl$(C_1$-$C_8)$alkylene-, and each $R^2$ is independently $(C_1$-$C_6)$alkyl, optionally substituted with hydroxyl or oxo.

The $R^1$ groups can be optionally substituted with one or more substituent groups, wherein each the substituents are independently oxo, halo, $-OR^a$, $-SR^a$, cyano, nitro, trifluoromethyl, trifluoromethoxy, $(C_3$-$C_8)$cycloalkyl, $(C_2$-$C_7)$ heterocycle or $(C_2$-$C_7)$heterocycle $(C_1$-$C_8)$alkylene-, $(C_6$-$C_{10})$aryl, $(C_6$-$C_{10})$aryl$(C_1$-$C_8)$alkylene-, $(C_5$-$C_9)$heteroaryl, $(C_5$-$C_9)$heteroaryl$(C_1$-$C_8)$alkylene-, $-CO_2R^a$, $R^aC(=O)$ $O-$, $R^aC(=O)-$, $-OCO_2R^a$, $R^bR^cNC(=O)O-$, $R^aOC(=O)N(R^b)-$, $R^bR^cN-$, $R^bR^cNC(=O)-$, $R^aC(=O)N(R^b)-$, $R^bR^cNC(=O)N(R)-$, $R^bR^cNC(=S)N(R^b)-$, $-OPO_3R^a$, $R^aOC(=S)-$, $R^aC(=S)-$, $-SS^a$, $R^aS(=O)-$, $-NNR^b$, $-OPO_2R^a$, or two $R^1$ groups can form a ring together with the atom to which they are attached. $R^a$, $R^b$ and $R^c$ are each independently hydrogen, $(C_1$-$C_8)$alkyl, or substituted $(C_1$-$C_8)$alkyl wherein the substituents include 1, 2, or 3 $(C_1$-$C_8)$alkoxy, $(C_3$-$C_8)$cycloalkyl, $(C_1$-$C_8)$alkylthio, amino, aryl, or aryl$(C_1$-$C_8)$alkylene, or R and R, can form a ring together with the nitrogen atom to which they are attached. Exemplary rings include pyrrolidino, piperidino, morpholino, or thiomorpholino. Exemplary halo groups include fluoro chloro or bromo. The $R^1$ and $R^2$ alkyl groups can independently be straight or branched chains. The $R^1$ groups independently can be optionally interrupted with a hetero atom, (e.g., oxygen, sulfur or nitrogen. M represents a metal, x is 1, 2, 3, 4, or 5, and y is the valence number of the metal, (e.g., y can be 3 for aluminum, 4 for titanium and zirconium, and may vary depending upon the oxidation state of the metal, provided that y−x≥1, (e.g., there must be at least one alkoxy group bonded to the metal atom.

Exemplary metals include aluminum, antimony, arsenic, barium, bismuth, boron, cerium, gadolinium, gallium, germanium, halfnium, indium, iron, lanthanum, lithium, magnesium, molybdenum, neodymium, phosphorus, silicon, sodium, strontium, tantalum, thallium, tin, titanium, tungsten, vanadium, yttrium, zinc, and zirconium. or a mixture thereof. Non-limiting examples of specific metal alkoxides include tetra(methoxy) titanate, tetra(ethoxy) titanate, tetra (isopropoxy) titanate, tetra(n-propoxy)titanate, tetra(butoxy) titanate, methyltriacetoxy silane, fluorinated silanes (e.g., such as fluorinated polyether silanes disclosed in U.S. Pat. No. 6,991,826), tetra(n-propoxy) zirconate, and mixtures thereof. Additional examples include vaporizable pre(co) polymerized forms of the above metal alkoxides including dimers, trimers, and longer oligomers including polydimethoxysiloxane and polybutyl titanate. Additional metal alkoxides include methoxy, ethoxy, n-propoxy, butoxy, acetoxy, and isopropoxy functionalized metal atoms, and pre(co)polymerized forms of those metal alkoxides, including tetra(ethoxy) titanate, tetra(n-propoxy) titanate, tetra (isopropoxy) titanate, methyltriacetoxy silane, fluorinated silanes, polydimethoxy silane, and tetra(n-propoxy) zirconate.

In some embodiments, the metal alkoxide and optional organic materials or compounds can be evaporated together to form a mixed vapor or they can be evaporated separately and mixed in the vapor phase. In applications where the alkoxide and the organic compound (or another metal alkoxide) are immiscible, it may be desirable to mix these materials in the vapor phase after separate evaporation. The alkoxide and organic compound may be condensed onto the substrate at a temperature below the condensation point of the vapor stream.

The metal alkoxides and optional organic materials or compounds can be vaporized using a variety of methods known in the art. Exemplary methods include evaporation, (e.g., flash evaporation, using techniques like those disclosed in U.S. Pat. Nos. 4,954,371 and 6,045,864, sublimation, and the like. The evaporation can be conducted under vacuum or at atmospheric pressure. Carrier gas flows (optionally heated) may be added to the evaporator to reduce the partial pressure of the metal alkoxide vapor or to increase the evaporation rate. The alkoxide may be condensed onto the substrate at a temperature below the condensation point of the vapor stream.

The condensed alkoxide layer is cured by contacting the layer with water. For example, the layer can be contacted with water vapor, liquid water or a plasma containing water vapor. Curing can be enhanced with heat. Heat can be provided using any suitable source, (e.g., an infra red heater or a catalytic combustion heater. The catalytic combustion heater can also provide water vapor. Additional energy can be provided by UV or vacuum UV light input into the condensed alkoxide layer during the curing process.

The curing reactions may be accelerated with vaporizable catalysts. Exemplary catalysts include organic acids such as acetic acid and methane sulfonic acid, photoacid generators such as triphenyl sulfonium and diphenyl iodonium compounds, or basic materials such as ammonia and photobase generators. Photoactive catalysts can be activated by exposure to UV light. The catalyst can condense into the coating layer or adsorb on the surface to promote the curing reactions.

In another embodiment, a metal alkoxide and an organic compound can be vaporized, condensed on the substrate, and cured. In one embodiment, the curing can include contacting the layer with water. Curing can involve reaction of the alkoxide with water to solidify the film layer or increase its viscosity together with (co)polymerization of the organic compound to form an intermixed film layer. Curing can also be conducted in sequential steps. The components of the layer can be pre-reacted to form a volatilizable oligomer prior to deposition. Curing can also include reaction of the components of the layer (alkoxide and organic compound) together with or without water to form an organometallic (co)polymer. The films prepared having the organometallic (co)polymer method may be designed to exhibit barrier properties not obtained if the films are prepared by separate deposition and curing of the two components.

Optional Adhesion Promoting Layer(s)

The adhesion between the substrate and the dyad (s), the (co)polymer layer and the oxide layer of the dyad(s), the optional oxide layer and the outer (co)polymer layer, or the outer (co)polymer layer and the optional oxide layers overlaying the outer (co)polymer layer, if present, can be further improved by applying an adhesion-promoting layer 14 to the substrate 15, and/or any of the (co)polymer layers 13 (A-N) and/or the oxide layers 12(A-n), and/or between any of the dyads 20, and/or between the dyads 21 and the outer (co)polymer layer 11, and/or between the outer (co)polymer layer and the optional outer oxide layers 16(A-N), or between any of the plurality 21 of optional outer oxide layers 16(A-N).

The adhesion-promoting layers can be, for example, a separate (co)polymeric layer or a metal-containing layer such as a layer of a metal, an alloy, an oxide, a metal oxide, a metal nitride, or a metal oxynitride such as those disclosed in U.S. Pat. No. 3,601,471 (Seddon) or U.S. Pat. No. 3,682,528 (Apfel et al.) and include, for example, Cr, Ti, Ni, NiCr alloys, or ITO. The adhesion-promoting layer may have a thickness of from a few nanometers (e.g., 1 nm or 2 nm) to about 10 nm and can be thicker if desired.

The interlayer adhesion-promoting layers that can be utilized may also act as diffusion barriers. Examples of adhesion promotion layers with diffusion barrier properties include aluminum, aluminum oxide, copper, copper oxides, silicon, silicon oxides, titanium, titanium oxides, titanium nitride, titanium tungstate, tantalum, tantalum oxides, tantalum nitride, chromium, chromium oxides, and silicon nitrides. Suitable adhesion-promoting additives include mercaptans, thiol-containing compounds, acids (such as carboxylic acids or organic phosphoric acids), triazoles, dyes, and wetting agents. Ethylene glycol bisthioglycolate, and phenylthioethyl acrylate (PTEA) are particularly preferred additives. The additive preferably is present in amounts sufficient to obtain the desired degree of increased adhesion, without causing undue degradation of other layers. Corona treatment or plasma discharge can also be used to increase adhesion to the support layer or dielectric layers.

The smoothness and continuity of each layer of the multilayer barrier film and its adhesion to the preceding layer preferably are enhanced by appropriate pretreatment of the preceding layer. A preferred pretreatment regiment involves electrical discharge pretreatment of the preceding layer in the presence of a reactive or non-reactive atmosphere (e.g., plasma, glow discharge, corona discharge, dielectric barrier discharge or atmospheric pressure discharge); chemical pretreatment; flame pretreatment; or application of a nucleating layer such as the oxides and alloys described in U.S. Pat. Nos. 3,601,471 and 3,682,528 and PCT Pat. Publ. No. WO2008/083308 (Stoss et al.). These pretreatments help ensure that the surface of the preceding will be receptive to the subsequently applied layer. Plasma pretreatment is particularly preferred for certain embodiments. Similar pretreatments or application of a nucleating layer are preferably used on each organic layer before deposition of each oxide layer.

It can be advantageous to deposit a metal oxide nucleation layer on the substrate, any or all of the (co)polymer layer(s), or any or all of the oxide layer(s), to produce barriers that have high optical transmission and low atomic oxygen degradation. The use of zinc oxide or aluminum-doped zinc oxide (AZO) as a nucleation or seed layer on the organic layers contiguous to the oxide layers of the FP stack used in the filter of this invention is described more fully in PCT Pat. Publ. No. WO2008/083388 (Stoss et al.)

Crosslinked (co)polymeric adhesion promoting layers can be formed from a variety of organic materials. Preferably the (co)polymeric layer is crosslinked in situ atop the first oxide or alloy layer. If desired, the (co)polymeric layer can be applied using conventional coating methods such as roll coating (e.g., gravure roll coating) or spray coating (e.g., electrostatic spray coating), then crosslinked using, for example, UV radiation. Most preferably the (co)polymeric layer is formed by flash evaporation, vapor deposition and crosslinking of a monomer as described above for the basecoat layer. Volatilizable acrylamides (such as those disclosed in U. S. Pat. Publ. No. 2008/0160185 (Endle et al.)) and (meth)acrylate monomers are preferred for use in such a process, with volatilizable acrylate monomers being especially preferred. Fluorinated (meth)acrylates, silicon (meth)acrylates and other volatilizable, free radical-curing monomers can be used. Coating efficiency can be improved by cooling the support. Particularly preferred monomers include multifunctional (meth)acrylates, used alone or in combination with other multifunctional or monofunctional (meth)acrylates, such as phenylthioethyl acrylate, hexanediol diacrylate, ethoxyethyl acrylate, phenoxyethyl acrylate, cyanoethyl(mono) acrylate, isobornyl acrylate, isobornyl methacrylate, octadecyl acrylate, isodecyl acrylate, lauryl acrylate, beta-carboxyethyl acrylate, tetrahydrofurfuryl acrylate, dinitrile acrylate, pentafluorophenyl acrylate, nitrophenyl acrylate, 2-phenoxyethyl acrylate, 2-phenoxyethyl methacrylate, 2,2,2-trifluoromethyl (meth)acrylate, diethylene glycol diacrylate, triethylene glycol diacrylate, triethylene glycol dimethacrylate, tripropylene glycol diacrylate, tetraethylene glycol diacrylate, neopentyl glycol diacrylate, propoxylated neopentyl glycol diacrylate, polyethylene glycol diacrylate, tetraethylene glycol diacrylate, bisphenol A epoxy diacrylate, 1,6-hexanediol dimethacrylate, trimethylol propane triacrylate, ethoxylated trimethylol propane triacrylate, propylated trimethylol propane triacrylate, tris (2-hydroxyethyl)-isocyanurate triacrylate, pentaerythritol triacrylate, phenylthioethyl acrylate, naphthloxyethyl acrylate, EBECRYL 130 cyclic diacrylate (available from Cytec Surface Specialties, West Paterson, N.J.), epoxy acrylate RDX80095 (available from Rad-Cure Corporation, Fairfield, N. J.), CN120E50 (available from Sartomer, Exton, Pa.), and mixtures thereof. A variety of other curable materials can be included in the crosslinked (co)polymeric layer, (e.g., vinyl ethers, vinyl naphthalene, acrylonitrile, and mixtures thereof.

The smoothness of the crosslinked (co)polymeric layers and their adhesion to the oxide layers of the barrier stack preferably advantageously may be enhanced by appropriate pretreatment of the first oxide layer prior to application of the crosslinked (co)polymeric layer, or by inclusion of a suitable additive in the crosslinked (co)polymeric layer. Preferred pretreatments include the pretreatments described above, with plasma pretreatment of the first oxide layer being particularly preferred. Preferred additives for the crosslinked (co)polymeric layer include the (co)polymer layer additives described above.

The smoothness, continuity, and conductivity of any additionally applied oxide layers and their adhesion to an underlying crosslinked (co)polymeric layer preferably are enhanced by appropriate pretreatment of the crosslinked (co)polymeric layer prior to application of the additionally applied oxide layer, or by inclusion of a suitable additive in the crosslinked (co)polymeric layer. Preferred pretreatments include the support pretreatments described above, with plasma pretreatment of the crosslinked (co)polymeric layer and use of a ZnO or AZO nucleation layer being particularly preferred.

System and Methods of Making UV Radiation and Atomic Oxygen Barrier Films

In further exemplary embodiments, the present disclosure describes a method of making the barrier film 10 according to any of the preceding embodiments. The method includes providing the substrate 15 comprised of a (co)polymer, applying at least one dyad 20 (AA-NN) to the substrate 15 by applying at least one (co)polymer layer 13 (AA-NN) overlaying the substrate and applying at least one oxide layer 12 (AA-NN) overlaying the at least one (co)polymer layer 13 (AA-NN) and applying an outer (co)polymer layer 11 overlaying the at least one dyad 20 (AA-NN). Optionally, the method includes applying at least one outer oxide layer 21(A-N) overlaying the outer (co)polymer layer 13.

The barrier films 10 transmit visible light and transmits, at an incident light angle of at least one of 0°, 30°, 45°, 60°, or 75°, at most 70 percent of incident ultraviolet light in a wavelength range from at least 100 nanometers to 400 nanometers or more preferably in a wavelength range from at least 100 nm to 350 nm. The barrier films 10 also exhibit an atomic oxygen degradation, when tested according to the Atomic Oxygen Degradation Test described herein, of less than $1 \times 10^{-20}$ mg/atom, $1 \times 10^{-21}$ mg/atom, or $1 \times 10^{-22}$ mg/atom.

Figure 2:
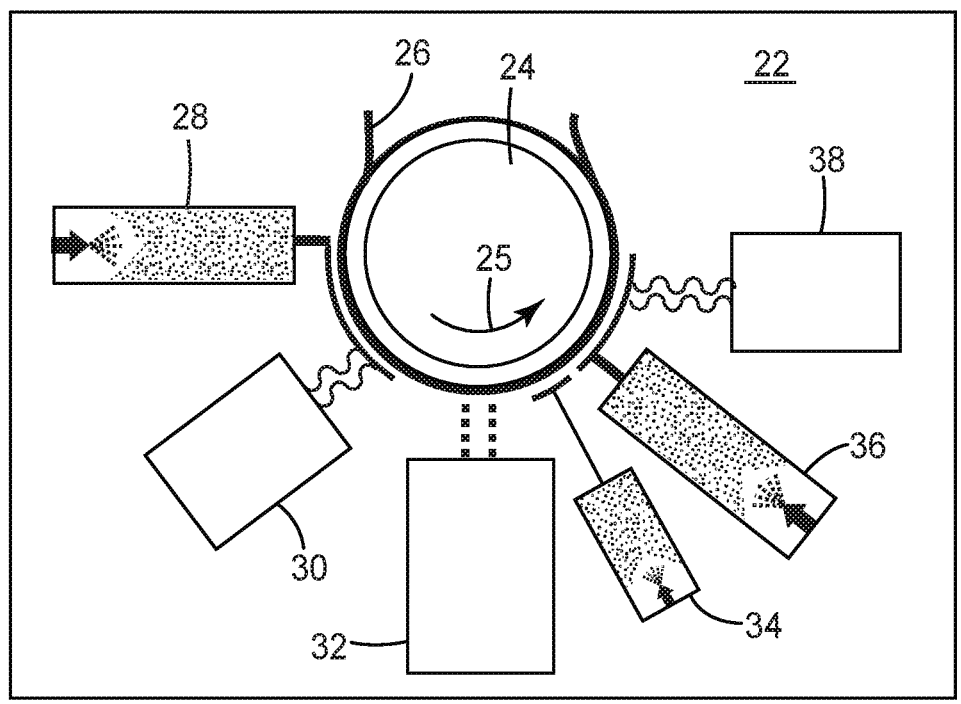
FIG. 2 is a schematic diagram illustrating an exemplary process for making a barrier film according to various exemplary embodiments disclosed herein.

Referring now to FIG. 2, FIG. 2 is a diagram of a system 22 illustrating an exemplary process for making barrier film 10. System 22 is preferably under vacuum and preferably includes a chilled drum 24 for receiving and transporting a substrate 15 (shown as a flexible film 26) extending between a source roller and a take-up roller (not shown in FIG. 2), thereby providing a moving web of film 26.

In illustrative embodiments shown in FIG. 2, an evaporator 28 applies a (co)polymer layer to the moving web of film 26 (substrate 15), which is cured by curing unit 30 to form at least one (co)polymer layer 13 (AA-NN) overlaying the substrate 15 as shown in FIG. 1, as drum 24 advances the film 26 in a direction shown by arrow 25. In certain exemplary embodiments, an oxide sputtering unit 32 applies at least one oxide layer 12 (AA-NN) overlaying the at least one (co)polymer layer 13 (AA-NN), thereby forming at least one dyad 20 (AA) and preferably a plurality of dyads 20 (AA-NN) positioned on the substrate 15 as drum 24 advances film 26 (substrate 15).

For additional dyads 20 (AA-NN), alternating (co)polymer (co)polymer layers 13 (AA-NN) and oxide layers 12 (AA-NN) overlaying the at least one (co)polymer layer 13 (AA-NN) forming a plurality of dyads 20 (AA-NN) positioned on the substrate 15, drum 24 can rotate in a reverse direction opposite arrow 25 and then advance film 26 (substrate 15) again to apply the additional alternating (co)polymer and oxide layers, and that sub-process can be repeated for as many dyads 20 (AA-NN) as desired or needed.

In some exemplary embodiments, forming a plurality of dyads 20 (AA-NN) overlaying the film 26 (substrate 15) comprises repeatedly applying the (co)polymer layer to the substrate and applying the oxide layer overlaying the (co) polymer layer to the substrate to create alternating (co) polymer layers and oxide layers between the substrate and the outer (co)polymer layer overlaying the plurality of dyads.

In some exemplary embodiments, applying the (co)polymer layer to the substrate comprises: evaporating at least one monomer, oligomer or pre-(co)polymer, condensing the at least one monomer, oligomer or pre-(co)polymer on the substrate, and curing the at least one monomer, oligomer or pre-(co)polymer to form the (co)polymer layer overlaying the substrate.

In some exemplary embodiments, applying the oxide layer comprises evaporating a metal alkoxide and reacting the metal alkoxide with water to form the oxide layer overlaying the (co)polymer layer overlaying the substrate, or sputter depositing an oxide material to form the oxide layer overlaying the (co)polymer layer overlaying the substrate as described further below.

Once the desired number of dyads 20 (AA-NN) are deposited or formed on film 26 (substrate 15), drum 24 further advances the film 26 (substrate 15), and in certain exemplary embodiments, a coating apparatus 34 and/or second evaporator 36 deposits the outer (co)polymer layer 11 overlaying the at least one dyad 20 (AA-NN, FIG. 1). The outer (co)polymer layer 11 can be cured by curing unit 38. The outer (co)polymer layer 11 can include, for example, a radiation cured monomer (e.g., a (meth)acrylate monomer), oligomer or pre-(co)polymer.

Optionally and preferably, the method includes depositing at least one outer oxide layer 21 (FIG. 1), which may be a plurality of outer oxide layers 21(A-N, FIG. 1), overlaying the outer (co)polymer layer 11. Applying the oxide layer may comprise evaporating a metal alkoxide and reacting the metal alkoxide with water to form the oxide layer overlaying the (co)polymer layer overlaying the substrate, or sputter depositing an oxide material to form the oxide layer overlaying the (co)polymer layer overlaying the substrate.

This may be accomplished, for example, by rotating drum 24 in a reverse direction opposite arrow 25 and then advancing web of film 26 (substrate 15) again to pass under oxide sputtering unit 32 and/or second evaporator 36 to deposit an oxide layer or an oxide layer precursor as described further below.

Alternatively, a second oxide sputtering unit and/or third evaporator (not shown in FIG. 2) may be positioned around rotating drum 24 after coating apparatus 34 and/or second evaporator 36.

In addition to the system 22 shown in FIG. 2, it is within the scope of the present disclosure to provide an in-line system configuration in which an advancing web of film 26 (substrate 15) is sequentially exposed to each of the foregoing system components and processing steps in an in-line single-pass process using multiple oxide sputtering units, evaporators, coating units and curing units.

Barrier films according to the present disclosure can be prepared by a variety of production methods. These methods include liquid coating techniques such as solution coating, roll coating, dip coating, spray coating, spin coating, and dry coating techniques such as Chemical Vapor Deposition (CVD), Plasma Enhanced Chemical Vapor Deposition (PECVD), sputtering and vacuum processes for thermal evaporation of solid materials. Each of these methods has limitations.

Chemical deposition methods (CVD and PECVD) form vaporized metal alkoxide precursors that undergo a reaction, when adsorbed on a substrate, to form inorganic coatings. These processes are limited to low deposition rates (and consequently low line speeds), and make inefficient use of the alkoxide precursor (much of the alkoxide vapor is not incorporated into the coating). The CVD process also requires high substrate temperatures, often in the range of 300-500° C., which may not be suitable for (co)polymer substrates.

Sputtering has also been used to form metal oxide layers. This process is characterized by slow deposition rates allowing web speeds of just a few feet/min. Another characteristic of the sputtering process is its very low material utilization, because a major part of the solid sputtering target material does not become incorporated in the coating. The slow deposition rate, coupled with the high equipment cost, low utilization of materials, and very high energy consumption, makes it expensive to manufacture films by sputtering.

Vacuum processes such as thermal evaporation of solid materials (e.g., resistive heating or e-beam heating) also provide low metal oxide deposition rates. Thermal evaporation is difficult to scale up for roll wide web applications requiring very uniform coatings (e.g., optical coatings) and can require substrate heating to obtain quality coatings. Additionally, evaporation/sublimation processes can require ion-assist, which is generally limited to small areas, to improve the coating quality.

The Examples describe in more detail exemplary processes using such systems to make exemplary barrier films 10.

Methods of Forming Optional Multilayer Optical Film Layers

Suitable methods for producing multilayer optical films or ultraviolet light shielding mirror films with a controlled transmission spectrum may include the use of an axial rod heater control of the layer thickness values of coextruded (co)polymer layers as described, for example, in U.S. Pat. No. 6,783,349 (Neavin et al.) and 10,514,482 (Hebrink et al.), the entire disclosures of which are incorporated herein by reference; timely layer thickness profile feedback during production from a layer thickness measurement tool such as an atomic force microscope (AFM), a transmission electron microscope, or a scanning electron microscope; optical modeling to generate the desired layer thickness profile; and repeating axial rod adjustments based on the difference between the measured layer profile and the desired layer profile.

The basic process for layer thickness profile control involves adjustment of axial rod zone power settings based on the difference of the target layer thickness profile and the measured layer profile. The axial rod power increase needed to adjust the layer thickness values in a given feedblock zone may first be calibrated in terms of watts of heat input according to nanometer of resulting thickness change of the layers generated in that heater zone. For example, fine control of the spectrum is possible using 24 axial rod zones for 275 layers. Once calibrated, the necessary power adjustments can be calculated once given a target profile and a measured profile. The procedure is repeated until the two profiles converge.

The layer thickness profile (layer thickness values) of multilayer optical film described herein reflecting at least 50 percent of incident UV light over a specified wavelength range can be adjusted to be approximately a linear profile with the first (thinnest) optical layers adjusted to have about a ¼ wave optical thickness (index times physical thickness) for 100 nm light and progressing to the thickest layers which would be adjusted to be about ¼ wave thick optical thickness for 280 nm light.

Dielectric mirrors, with optical thin film stack designs comprised of alternating thin layers of inorganic dielectric materials with refractive index contrast, are particularly suited for this. In recent decades they are used for applications in UV, Visible, NIR and IR spectral regions. Depending upon the spectral region of interest there are specific materials suitable for that region. Also, for coating these materials, one of two forms of physical vapor deposition (PVD) are used: evaporation or sputtering. Evaporated coatings rely upon heating the coating material (evaporant) to a temperature at which it evaporates. This is followed by condensation of the vapor upon a substrate. For evaporated dielectric mirror coatings, the electron-beam deposition process is most commonly used.

Sputtered coatings use energetic gas ions to bombard a material ("target") surface, ejecting atoms which then condense on the nearby substrate. Depending upon which coating method is used, and the settings used for that method, thin film coating rate and structure-property relationships will be strongly influenced. Ideally, coating rates should be high enough to allow acceptable process throughput and film performance, characterized as dense, low stress, void free, non-optically absorbing coated layers.

Exemplary embodiments can be designed to have peak reflectance at 254 nm, by both PVD methods. For example, coating discrete substrates by electron-beam deposition method, using $HfO_2$ as the high refractive index material and $SiO_2$ as the low refractive index material. Mirror design has alternating layers of "quarter wave optical thickness" (qwot) of each material, that are coated, layer by layer until, for example, after 13 layers the reflectance at 254 nm is >99%. The bandwidth of this reflection peak is around 80 nm. Quarter wave optical thickness is the design wavelength, here 254 nm, divided by 4, or 63.5 nm. Physical thickness of the high refractive index layers ($HfO_2$) is the quotient of qwot and refractive index of $HfO_2$ at 254 nm (2.41), or 30.00 nm. Physical thickness of the low refractive index layers ($MgF_2$), with 254 nm refractive index at 1.41, is 45.02 nm. Coating a thin film stack, then, which is comprised of alternating layers of $HfO_2$ and $SiO_2$ and designed to have peak reflectance at 254 nm begins by coating layer 1 $HfO_2$ at 30.00 nm.

In electron beam deposition a four-hearth evaporation source is used. Each hearth is cone-shaped and 17 $cm^3$ volume of $HfO_2$ chunks fill it. The magnetically deflected high voltage electron beam is raster scanned over the material surface as filament current of the beam is steadily, in a pre-programmed fashion, increased.

Upon completion of the pre-programmed step the $HFO_2$ surface is heated to evaporation temperature, about 2500° C., and a source shutter opens, the $HfO_2$ vapor flux emerging from the source in a cosine-shaped distribution and condensing upon the substrate material above the source. For enhancement of coating uniformity, the substrate holders rotate during deposition. Upon reaching the prescribed coating thickness (30.00 nm) the filament current shuts off, the shutter closes and the $HfO_2$ material cools.

For layer 2 the evaporation source is then rotated to a hearth containing chunks of $MgF_2$ and a similar pre-programmed heating process begins. Here, the $MgF_2$ surface temperature is about 950° C. when the source shutter opens and, upon reaching the prescribed coating thickness (45.02 nm), the filament current shuts off; the shutter closes and the $HfO_2$ material cools. This step-wise process is continued, layer by layer, until the total number of design layers is reached. With this optical design, as total layers are increased, from 3 to 13, the resulting peak reflectance increases accordingly, from 40% at 3 layers to >99% at 13 layers.

In another exemplary embodiment, UV transparent films can be coated in continuous roll to roll (R2R) fashion, using ZrON as the high refractive index material and $SiO_2$ as the low refractive index material. The optical design is the same type of thin film stack, alternating qwot layers of the two materials. For ZrON, with refractive index at 254 nm of 2.25, the physical thickness target was 28.22 nm. For $SiO_2$, here sputtered from an aluminum-doped silicon sputter target, with refractive index 1.49, the target thickness was 42.62 nm.

Layer one ZrON is DC sputtered from a pure zirconium sputter target in a gas mixture of argon, oxygen and nitrogen. Whereas argon is the primary sputtering gas, oxygen and nitrogen levels are set to achieve transparency, low absorptance and high refractive index. The film roll transport initially starts at a pre-determined speed, and the sputter source power is ramped to full operating power, followed by introduction of the reactive gases and then achieving steady state condition. Depending upon the length of film to coat, the process continues until total footage is achieved. Here, as the sputter source is orthogonal to and wider than the film which is being coated, the uniformity of coating thickness is quite high.

Upon reaching the desired length of coated film the reactive gases are set to zero and the target is sputtered to a pure Zr surface state. The film direction is next reversed and silicon (aluminum doped) rotary pair of sputter targets has AC frequency (40 kHz) power applied in an argon sputtering atmosphere. Upon reaching steady state, oxygen reactive gas is introduced to provide transparency and low refractive index. At the pre-determined process setting and line speed the second layer is coated over the length which was coated for layer one. Again, as these sputter sources are also orthogonal to and wider than the film being coated, the uniformity of coating thickness is quite high. After reaching the desired length of coated film the reactive oxygen is removed and the target is sputtered in argon to a pure silicon (aluminum doped) surface state. Layers three to five or seven or nine or eleven or thirteen, depending upon peak reflectance target, are coated in this sequence. Upon completion, the film roll is removed for post-processing.

For manufacturing of these inorganic coatings, the electron beam process is best suited for coating discrete parts. Though some chambers have demonstrated R2R film coating, the layer by layer coating sequence would still be necessary.

For R2R sputtering of barrier films 10 or oxide layers 12 or 16, it is advantageous to use a sputtering system with multiple sources located around one, or perhaps two, coating drums. Here, for a thirteen layers optical stack design, a two, or even single, machine pass process, with alternating high and low refractive index layers coated sequentially, would be feasible. How many machine passes needed would be contingent upon machine design, cost, practicality of thirteen consecutive sources, and the like. Additionally, coating rates would need to be matched to a single film line speed.

The operation of the present disclosure will be further described with regard to the following detailed examples. These examples are offered to further illustrate the various specific and preferred embodiments and techniques. It should be understood, however, that many variations and modifications may be made while remaining within the scope of the present disclosure.

Methods of Forming Optional Adhesion Promoting Layers

In certain exemplary embodiments, the process advantageously further comprises forming an adhesion-promoting layer positioned between at least one of the substrate and the at least one dyad, the (co)polymer layer and the oxide layer of the at least one dyad, or the oxide layer and the outer (co)polymer layer, optionally wherein the adhesion promoting layer comprises the reaction product of at least one silane compound.

Notwithstanding the system 22 shown in FIG. 2, it is to be understood that adhesion-modifying layers may be present at any interface, as described above. In some embodiments, one or more layers may comprise an adhesion-promoting layer. In yet other embodiments, a first layer may comprise an adhesion-promoting layer, while a second layer may comprise a release layer. Thus, system 22 may comprise additional evaporators, oxide sputtering units, coating and/or curing units or the location of the existing evaporators/curing units may be altered.

Alternatively, for additional alternating layers of oxide, adhesion-modifying layer, and top (co)polymer layer, drum 24 can rotate in a reverse direction opposite arrow 25 and then advance film 26 again to apply the optional additional outer oxide layers, adhesion-modifying layers, and top (co)polymer layers. This sub-process can be repeated for as many alternating layers as desired or needed.

Adhesion-promoting materials often have at least one moiety that is reactive with or capable of non-reactive interaction with at least one adjacent layer. In some embodiments, the moieties are reactive and/or capable of non-reactive interaction with both adjacent layers. Exemplary materials for use in the adhesion-promoting layer include, for example, silanes (e.g., silane coupling agents, alkoxy silanes, halo silanes, acetoxy silanes, cyclic aza-silanes, and amino functional silanes), hydroxamic acids, phosphoric acid esters, phosphonic acid esters, phosphonic acids, zirconates, titanates, and the like, all of which may have additional reactive groups such as, for example, (meth)acrylate and epoxy. Suitable adhesion-promoting materials and process for applying adhesion promoting layers to a substrate are described in U.S. Pat. Nos. 9,790,396; 9,982,160; 10,011,735; 10,533,111; 10,774,236 and 10,804,419, the entire disclosures of which are incorporated herein by reference.

In some embodiments, the adhesion-promoting layer is a silane coupling agent. A characteristic of this type of material is its ability to react with metal-hydroxyl(metal-OH) groups on a freshly sputter deposited metal oxide layer, such as, for example, a freshly sputtered $SiO_2$ layer with surface hydroxyl-silanol (Si—OH) groups. The amount of water vapor present in a multi-process vacuum chamber can be controlled sufficiently to promote the formation of Si—OH groups in high enough surface concentration to provide increased bonding sites. With residual gas monitoring and the use of water vapor sources, the amount of water vapor in a vacuum chamber can be controlled to ensure adequate generation of Si—OH groups.

Typically, adhesion between the release layer and at least one adjacent layer is low enough to enable the removal of said adjacent layer under appropriate conditions, but not so low that the layers prematurely separate by forces normally encountered in normal handling and processing operations. Exemplary materials used in the release layer include silicones, fluorinated materials (e.g., monomers, oligomers, or (co)polymers containing fluoroalkyl or fluoroalkylene or perfluoropolyether moieties), soluble materials, alkyl chains (e.g., straight, branched, and/or cyclic hydrocarbon moieties containing 12-36 carbon atoms), and the like.

The films and processes described herein improve the overall adhesion and adhesion retention of vapor deposited multilayer barrier coatings after exposure to moisture by the addition of a separate adhesion-modifying layer. In some embodiments, the adhesion-modifying layer is applied in a vapor coating process where the adhesion-modifying layer adsorbs or condenses onto a moving web substrate that has just been sputter coated with an oxide of silicon and aluminum. The adsorbed or condensed layer may then be exposed to subsequent processing steps, for example to curing (e.g., electron beam radiation), additional inorganic layer sputtering, and/or or additional (co)polymer layer deposition. With the addition of the adhesion-promoting layer the peel strength adhesion is greatly improved, especially after exposure to high heat and humidity conditions. Additionally, the addition of the adhesion-modifying layer removes the need for a tie layer, which greatly simplifies the coating process and barrier coating stack construction. The resulting barrier coatings retain high barrier properties and optical transmission performance.

EXAMPLES

These examples are offered to further illustrate the various specific and preferred embodiments and techniques. It should be understood, however, that many variations and modifications may be made while remaining within the scope of the present disclosure.

Summary of Materials

Unless otherwise noted, all parts, percentages, ratios, etc. in the Examples and the rest of the specification are by weight. Solvents and other reagents used may generally be obtained from Sigma-Aldrich Chemical Company (Milwaukee, WI) unless otherwise noted.

Test Methods

Static Decay Time Test

Static decay time was measured using a static decay meter (obtained under the trade designation "ETS MODEL 4406" from Electro-Tech Systems, Inc., Perkasie, PA). Static decay time was measured by applying a voltage of +/−5 kV to the test specimen, then grounding it and monitoring the time needed for 90% of the voltage to dissipate. The coated side was facing towards the voltage sensor during measurement. If a sample was not conductive enough to charge to +/−5 kV for the test, it was marked as "DNC" (did not charge).

Spectral Transmission Test

Spectral transmission was measured using a spectrophotometer (obtained under the trade designation "LAMBDA 1050" from PerkinElmer, Inc., Waltham, MA). Spectral transmission is reported as average percent transmission between 200 nm and 400 nm and between 400 nm and 1500 nm at a 0° angle of incidence, incident onto the coated side of the test specimens.

Atomic Oxygen Degradation Test

The test specimens, and polyimide film specimens to be used as test "witnesses" (obtained under the trade designation "KAPTON HN" from E. I. DuPont de Nemours, Wilmington, DE), were cut as 1.5"×1.5" (3.81 cm×3.81 cm) squares and weighed on a high precision balance capable of measuring mass to 0.1 mg (obtained under the trade designation "PRACTUM64-1S" from Sartorius Corporation, Bohemia, NY). The test specimens and witnesses were placed on a glass plate ¼" (0.635 cm) thick, then covered with a ⅛" (0.3175 cm) glass masking plate with 1" (2.54 cm) diameter circular holes cut from it. The masking plate was placed such that the test specimens and witnesses were centered underneath the circular holes. The masking plate was then taped to the bottom glass plate to hold the assembly together, and placed into a batch plasma system, on the powered electrode of the plasma reactor.

The test specimens and witnesses were exposed to an oxygen plasma using a batch plasma reactor (obtained under the trade designation "PLASMA-THERM 3032" from Plasma-Therm LLC, St. Petersburg, FL). The instrument was configured for reactive ion etching with a 26" (66.0 cm) lower powered electrode and central gas pumping. The chamber was pumped with a roots type blower (obtained under the trade designation "EH1200" from Edwards Engineering, Burgess Hill, UK) backed by a dry mechanical pump (obtained under the trade designation "iQDP80" from Edwards Engineering). The RF power was delivered by a 3 kW, 13.56 Mhz solid-state generator (obtained under the trade designation "RFPP RF30S" from Advanced Energy Industries, Fort Collins, CO). The system had a nominal base pressure of 5 millitorr (0.67 Pa). The flow rates of the gases were controlled by MKS flow controllers (obtained from MKS Instruments, Andover, MA).

After pumping down to the base pressure, oxygen ($O_2$) was introduced at 500 standard cubic cm/min (sccm). Once the gas flow stabilized in the reactor, rf power (2000 watts) was applied to the electrode to generate the plasma. The plasma was ignited for a total exposure time of 4 hours. Following completion of the plasma treatment, the chamber was vented to the atmosphere and the test specimens and witnesses were removed from the chamber. The mass of each test specimen and witness was measured again, and the change in mass was recorded. The effective atomic oxygen fluence (atoms) of the plasma treatment was determined by dividing the mass loss of the KAPTON HN witnesses by the density of KAPTON HN (1.412 g/cm$^3$) and by the atomic oxygen erosion yield of KAPTON HN (2.81E-24 cm$^3$/atom).

The plasma treatment described above was calculated to have produced an effective atomic oxygen fluence of 1.38E21 atoms/cm$^2$. The mass loss of the test specimens was then divided by the effective atomic oxygen fluence to determine the mass loss per effective atomic oxygen atom (mg/atom). Thus, the atomic oxygen degradation is quantified as the mass loss per effective atomic oxygen atom (mg/atom).

Comparative Examples

Comparative Example A

Barrier films were prepared by covering a 5 mil (0.127 mm) fluorinated ethylene propylene (FEP) substrate film (obtained under the trade designation "TEFLON FEP100 500A" from E. I. DuPont de Nemours, Wilmington, DE) with a stack of a first polymer layer, an inorganic boron doped silicon oxide (SiOx:B) barrier layer, and a second polymer layer on a vacuum coater similar to the coater described in U.S. Pat. No. 5,440,446 (Shaw et al.) and U.S. Pat. No. 7,018,713 (Padiyath et al), both of which are incorporated herein by reference in their entireties. The individual layers were formed as follows:

Layer 1 (first polymer layer): A 350 meter long roll of 0.127 mm thick×366 mm wide PET film (obtained under the trade designation "XST 6642" from E. I. DuPont de Nemours, Wilmington, DE) was loaded into a roll-to-roll vacuum processing chamber. Sheets of FEP substrate were taped to the PET film using polyimide tape. The chamber was pumped down to a pressure of less than 1E-5 Torr. A web speed of 2.5 meter/minute was held while maintaining the backside of the PET film in contact with a coating drum chilled to −23° C.

With the PET film backside in contact with the drum, the substrate frontside surface was treated with a nitrogen plasma at 0.15 kW of plasma power. The substrate frontside surface was then coated with tricyclodecane dimethanol diacrylate monomer (obtained under the trade designation "SR833S" from Sartomer USA, Exton, PA.). The monomer was degassed under vacuum to a pressure of 20 millitorr prior to coating, loaded into a syringe pump, and pumped at a flow rate of 1.0 milliliter/minute through an ultrasonic atomizer operating at a frequency of 60 kHz into a heated vaporization chamber maintained at 260° C.

The resulting monomer vapor stream condensed onto the film surface and was electron beam crosslinked using a multi-filament electron-beam cure gun operating at 7.0 kV and 4 mA to form a 750 nm thick first polymer layer. Then the film web was advanced and the film and substrate were wound up in a film roll in order to expose additional samples for coating.

Layer 2 (inorganic layer): After the first polymer deposition and winding up of the film and substrate, without removing the film roll or substrate from the vacuum processing chamber, the film was unwound to bring the substrate back onto the chill roll and to bring the backside of the PET film back into contact with the drum. Then a SiOx:B layer was reactive magnetron sputter-deposited onto the first polymer layer. One direct current (DC) power supply was used to control one cathode; with the cathode housing a boron doped silicon (Si:B) sputtering target (obtained from Materion Corporation, Mayfield Heights, OH).

During sputter deposition a predetermined oxygen flow to the cathode was maintained manually. The pulsed DC power supply sputtered the Si:B target using 2800 watts of power at 175 kHz pulsing, and 1.5 microsecond duration, with a gas mixture containing 110 standard cubic centimeter per minute (sccm) argon and 32 sccm oxygen at a sputter pressure of 3.1 millitorr at a line speed of 7.2 feet/minute (2.19 meter/minute). This provided a 25 nm thick SiOx:B layer deposited atop the first polymer layer of Layer 1.

Layer 3 (second polymer layer): Immediately after the SiOx:B layer deposition and with the backside of the PET film still in contact with the drum, acrylate monomer (same monomer of Layer 1) was condensed onto Layer 2 and crosslinked as described for Layer 1. This provided a 750 nm thick second polymer layer atop Layer 2. Then the film web was advanced and the film and substrate were wound up in a film roll in order to expose additional samples for coating.

Comparative Example B (CE-B)

CE-B was prepared in the same manner as CE-A, except that no layer 3 was deposited.

Comparative Example C (CE-C)

CE-C was prepared in the same manner as CE-B, except no layer 2 was deposited.

Comparative Example D (CE-D)

CE-D was prepared in the same manner as CE-A, except layers 1 and 3 were not deposited.

Comparative Example E

CE-E was prepared in the same manner as CE-D, except instead of sputter-depositing a layer of SiOx:B for layer 2, a layer of indium doped tin oxide (ITO) was magnetron sputter-deposited. One pulsed direct current (DC) power supply was used to control one cathode; with the cathode housing a 95% indium oxide 5% tin oxide (InOx:SnOx) sputtering target (obtained from Materion Corporation, Mayfield Heights, OH).

During sputter deposition a predetermined oxygen flow to the cathode was maintained manually. The DC power supply sputtered the InOx:SnOx target using 2800 watts of power at 10 kHz pulsing, and 3.4 microsecond duration, with a gas mixture containing 135 standard cubic centimeter per minute (sccm) argon and 2 sccm oxygen at a sputter pressure of 2.9 millitorr, at a line speed of 6.0 feet/minute (1.83 meter/minute). This provided a 25 nm thick indium tin oxide (ITO) layer.

Comparative Example F

CE-F was prepared in the same manner as CE-E, except instead of sputter-depositing a layer of ITO, a layer of aluminum doped zinc oxide (AZO) was magnetron sputter-deposited. One pulsed direct current (DC) power supply was used to control one cathode; with the cathode housing a 98% zinc 2% aluminum (ZnOx:Al) sputtering target (obtained from Materion Corporation, Mayfield Heights, OH). During sputter deposition a predetermined oxygen flow to the cathode was maintained manually.

The DC power supply sputtered the ZnOx:Al target using 2800 watts of power at 10 kHz pulsing, and 3.4 microsecond duration, with a gas mixture containing 200 standard cubic centimeter per minute (sccm) argon and 1.5 sccm oxygen at a sputter pressure of 2.9 millitorr, at a line speed of 3.5 feet/minute (1.07 meter/minute). This provided a 25 nm thick aluminum zinc oxide (AZO) layer.

Examples

Examples 1 and 2 (E-1 and E-2)

E-1 and E-2 were prepared in the sample manner as CE-A, except a fourth layer was deposited on top of the second polymer layer.

Layer 4 (SiOx:B or AZO): After the second polymer deposition and winding up of the film and substrate, without removing the film roll or substrate from the vacuum processing chamber, the film was unwound to bring the substrate back onto the chill roll and to bring the backside of the PET film back into contact with the drum. Then a layer of SiOx:B (E-1) or AZO (E-2) was sputter-deposited. The SiOx:B/AZO layers were deposited with the same conditions as the layers deposited on samples CE-D and CE-F.

Example 3 (E-3)

E-3 was prepared in the same manner as CE-A, except additional layers were sputter deposited on top of the second polymer layer.

Layer 4 (zirconium oxynitride (ZrON) layer 1): After the second polymer deposition and winding up of the film and substrate, the vacuum chamber was opened, the film was unwound, and the substrate was untaped from the PET roll. The substrate was then taped to a new roll of PET and returned to the vacuum processing chamber.

The film was unwound to bring the substrate onto the chill roll and to bring the backside of the PET film back into contact with the drum. Then a layer of ZrON was reactive magnetron sputter-deposited onto the second polymer layer. One alternating current (AC) power supply was used to control a pair of cathodes housing two zirconium (Zr) sputtering targets (obtained from Protech Materials, Hayward, CA).

The AC power supplies sputtered the Zr targets using 6000 watts of power, with a gas mixture containing 500 standard cubic centimeter per minute (sccm) argon, 28 sccm oxygen, and 49 sccm nitrogen, at a sputter pressure of 5.3 millitorr and a line speed of 6.2 feet/minute (1.89 meter/minute). Two passes under these conditions provided a 22.6 nm thick ZrON layer deposited atop the second polymer layer of Layer 3. Then the film web was advanced and the film and substrate were wound up in a film roll in order to expose additional samples for coating.

Layer 5 (SiOx:B layer 1): After the first ZrON deposition and winding up of the film and substrate, without removing the film roll or substrate from the vacuum processing chamber, the film was unwound to bring the substrate back onto the chill roll and to bring the backside of the PET film back into contact with the drum. Then a layer of SiOx:B was deposited.

The pulsed magnetron sputter conditions of this layer were the same as those use in CE-A, except the gas mixture contained 30.5 sccm oxygen, at a sputter pressure of 3.9 millitorr and a line speed of 7.0 feet/minute (2.13 meter/minute). Two passes under these conditions provided a 40.6 nm layer of SiOx:B deposited atop the first ZrON layer. Then the film web was advanced and the film and substrate were wound up in a film roll in order to expose additional samples for coating.

Layer 6 (ZrON layer 2): After the Layer 5 deposition and winding up of the film and substrate, without removing the film roll or substrate from the vacuum processing chamber, the film was unwound to bring the substrate back onto the chill roll and to bring the backside of the PET film back into contact with the drum. Then a layer of ZrON was sputter-deposited under the same conditions as Layer 4. Then the film web was advanced and the film and substrate were wound up in a film roll in order to expose additional samples for coating.

Layer 7 (SiOx:B layer 2): After the Layer 6 deposition and winding up of the film and substrate, without removing the film roll or substrate from the vacuum processing chamber, the film was unwound to bring the substrate back onto the chill roll and to bring the backside of the PET film back into contact with the drum. Then Layer 7 was deposited in the same manner as layer 5. Then the film web was advanced and the film and substrate were wound up in a film roll in order to expose additional samples for coating.

Layer 8 (ZrON layer 3): After the Layer 7 deposition and winding up of the film and substrate, without removing the film roll or substrate from the vacuum processing chamber, the film was unwound to bring the substrate back onto the chill roll and to bring the backside of the PET film back into contact with the drum. Layer 8 was deposited in the same manner as layer 6. Then the film web was advanced and the film and substrate were wound up in a film roll in order to expose additional samples for coating.

Example 4 (E-4)

E-4 was deposited in the same manner as E-3, except a layer of ITO was deposited on top of the third layer of ZrON. After the third ZrON deposition and winding up of the film and substrate, without removing the film roll or substrate from the vacuum processing chamber, the film was unwound to bring the substrate back onto the chill roll and to bring the backside of the PET film back into contact with the drum. Then a layer of ITO was sputter-deposited onto the third ZrON layer. The sputter-deposition conditions for the ITO were the same as those described in CE-E, except the line speed was 12 feet/minute (3.66 meter/minute), and the 25 nm thick ITO coating was deposited in 2 passes.

Example 5 (E-5)

E-5 was prepared in the same manner as E-4, except a sheet of uncoated FEP was used as substrate instead of a sheet of FEP coated with a first organic polymer layer, a first inorganic SiOx:B layer, and a second polymer layer.

Comparative Example G (CE-G)

CE-G was prepared in the same manner as E-3, except a sheet of uncoated FEP was used as substrate instead of a sheet of FEP coated with a first organic polymer layer, a first inorganic SiOx:Blayer, and a second polymer layer.

For all Examples and Comparative Examples, Static decay time, Spectral Transmission (averaged over two ranges), and Mass loss per effective atomic oxygen atom were measured using the test methods described above. Results are reported in Table 1.

TABLE 1

Test Results for Comparative Examples and Examples

| Example ID | Static Decay Time (s) | Spectral Transmission (%) [Averaged over 200-400 nm] | Spectral Transmission (%) [Averaged over 400-1500 nm] | Mass Loss/ Effective Atomic Oxygen Atom (mg/atom) |
|---|---|---|---|---|
| CE-A | DNC | 70.1 | 93.3 | 4.01E−22 |
| CE-B | DNC | 66.0 | 92.5 | 2.58E−21 |
| CE-C | DNC | 73.7 | 92.8 | 1.30E−20 |
| CE-D | DNC | 73.0 | 95.0 | 5.07E−21 |
| CE-E | 0.002 | 43.9 | 89.7 | 3.01E−22 |
| CE-F | 0.002 | 50.8 | 92.3 | 3.15E−22 |
| E-1 | DNC | 49.8 | 91.5 | 0.00E+00 |
| E-2 | 0.002 | 44.4 | 90.4 | 1.43E−23 |
| E-3 | DNC | 37.8 | 84.4 | 2.86E−23 |
| E-4 | 0.002 | 25.1 | 81.6 | 2.86E−23 |
| E-5 | 0.002 | 26.6 | 78.1 | 1.58E−22 |
| CE-G | DNC | 42.7 | 82.4 | 1.58E−22 |

Descriptions for elements in figures should be understood to apply equally to corresponding elements in other figures, unless indicated otherwise. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

Reference throughout this specification to "one embodiment," "certain embodiments," "one or more embodiments" or "an embodiment," whether or not including the term "exemplary" preceding the term "embodiment," means that a particular feature, structure, material, or characteristic described in connection with the embodiment is included in at least one embodiment of the certain exemplary embodiments of the present disclosure. Thus, the appearances of the phrases such as "in one or more embodiments," "in certain embodiments," "in one embodiment" or "in an embodiment" in various places throughout this specification are not necessarily referring to the same embodiment of the certain exemplary embodiments of the present disclosure. Furthermore, the particular features, structures, materials, or characteristics may be combined in any suitable manner in one or more embodiments.

While the specification has described in detail certain exemplary embodiments, it will be appreciated that those skilled in the art, upon attaining an understanding of the foregoing, may readily conceive of alterations to, variations of, and equivalents to these embodiments. Accordingly, it should be understood that this disclosure is not to be unduly limited to the illustrative embodiments set forth hereinabove. In particular, as used herein, the recitation of numerical ranges by endpoints is intended to include all numbers subsumed within that range (e.g., 1 to 5 includes 1, 1.5, 2, 2.75, 3, 3.80, 4, and 5). In addition, all numbers used herein are assumed to be modified by the term "about."

Furthermore, all publications and patents referenced herein are incorporated by reference in their entirety to the same extent as if each individual publication or patent was specifically and individually indicated to be incorporated by reference. In the event of inconsistencies or contradictions between portions of the incorporated references and this application, the information in the preceding description Various exemplary embodiments have been described. These and other embodiments are within the scope of the following claims.

What is claimed is:

1. A barrier film comprising:
   a substrate comprised of a (co)polymer;
   at least one dyad positioned on the substrate, wherein the at least one dyad is comprised of a (co)polymer layer overlaying the substrate and an oxide layer overlaying the (co)polymer layer; and
   an outer (co)polymer layer overlaying the at least one dyad;
   wherein the barrier film transmits visible light and transmits, at an incident light angle of at least one of 0°, 30°, 45°, 60°, or 75°, at most 70 percent of incident ultraviolet light in a wavelength range from at least 100 nanometers to 400 nanometers or in a wavelength range from at least 100 nm to 350 nm, and
   further wherein the barrier film exhibits an atomic oxygen degradation, when tested according to the Atomic Oxygen Degradation Test, of less than $1\times10^{-20}$ mg/atom, $1\times10^{-21}$ mg/atom, or $1\times10^{-22}$ mg/atom.

2. The barrier film of claim 1, wherein the substrate (co)polymer comprises a fluoropolymer, a polyimide (co)polymer, a cyclic olefin (co)polymer, poly(ethylene terephthalate), poly(ethylene naphthalate), poly(methyl methacrylate), polycarbonate, polypropylene, polyethylene, polysulfone, poly(ether sulfone), polyurethane, polyamide, poly(vinyl butyral), poly(vinyl chloride), and polybenzoxazole, optionally wherein the fluoropolymer comprises tetrafluoroethylene, hexafluoropropylene, vinylidene fluoride, a perfluoroalkoxy alkane, or a combination thereof.

3. The barrier film of claim 1, wherein the at least one dyad is a plurality of dyads.

4. The barrier film of claim 1, wherein each (co)polymer layer in the at least one dyad and the outer (co)polymer layer comprises a (co)polymer selected from an olefinic (co)polymer, a (meth)acrylate (co)polymer, a urethane (co)polymer, a fluoropolymer, a silicone (co)polymer, or a combination thereof.

5. The barrier film of claim 1, wherein the outer (co)polymer layer overlaying the at least one dyad comprises at least one of a UV mirror film, a multilayer optical film, a heat sealable encapsulating film, or a combination thereof.

6. The barrier film of claim 4, wherein the outer (co)polymer layer is crosslinked.

7. The barrier film of claim 1, wherein at least one (co)polymer layer in the at least one dyad or the outer (co)polymer layer further comprises an ultraviolet radiation absorber, a hindered amine light stabilizer, an antioxidant, or a combination thereof.

8. The barrier film of claim 7, wherein the ultraviolet radiation absorber is selected from a benzotriazole compound, a benzophenone compound, a triazine compound, or a combination thereof.

9. The barrier film of claim 1, wherein the oxide layer in the at least one dyad comprises a metal oxide selected from silicon oxide, silica alumina oxide, gallium oxide, magnesium oxide, niobium oxide, titanium dioxide, yttrium oxide, zinc oxide, tin oxide, nickel oxide, aluminum doped zinc oxide, indium tin oxide, zirconium oxynitride, hafnia, alumina, alumina doped silica, lanthanum fluoride, neodymium fluoride, aluminum fluoride, magnesium fluoride, calcium fluoride, or a combination thereof.

10. The barrier film of claim 1, further comprising at least one outer oxide layer overlaying the outer (co)polymer layer and further wherein the at least one outer oxide layer overlaying the outer (co)polymer layer comprises at least one layer comprised of hafnia, zirconium oxynitride, silicon oxide, gallium oxide, indium tin oxide, niobium oxide, titanium dioxide, zinc oxide, tin oxide, nickel oxide, silica aluminum oxide, aluminum doped zinc oxide, or a combination thereof.

11. The barrier film of claim 10, wherein the at least one outer oxide layer comprises a plurality of outer oxide layers comprised of hafnia, zirconium oxynitride, silicon oxide, gallium oxide, indium tin oxide, tin oxide, nickel oxide, silica aluminum oxide, niobium oxide, titanium dioxide, zinc oxide, aluminum doped zinc oxide, or a combination thereof and a top layer comprised of silicon oxide.

12. The barrier film of claim 1, further comprising an adhesion-promoting layer positioned between at least one of the substrate and the at least one dyad, the (co)polymer layer and the oxide layer of the at least one dyad, or the oxide layer and the outer (co)polymer layer.

13. The barrier film of claim 1, wherein incident light transmission through the barrier film is greater than 30 percent in a wavelength range from at least 400 nanometers to 1500 nanometers.

14. An article comprising the barrier film of claim 1 applied to a surface of (i) a decorative object, the decorative object further comprising a graphic film, a paint, an ink, a stain, a dye, a lacquer, or a combination thereof, or (ii) an electronic device, the electronic device further comprising a light emitting device, a light receiving device, a photovoltaic device, a thin film transistor or a combination thereof.

15. A process of making the barrier film of claim 1, comprising:
providing the substrate;
applying the at least one dyad to the substrate by applying a (co)polymer layer overlaying the substrate and applying an oxide layer overlaying the (co)polymer layer; and
applying an outer (co)polymer layer overlaying the at least one dyad.

16. The process of claim 15, wherein applying the (co)polymer layer to the substrate comprises:
evaporating at least one monomer, oligomer or pre-(co)polymer;
condensing the at least one monomer, oligomer or pre-(co)polymer on the substrate; and
curing the at least one monomer, oligomer or pre-(co)polymer to form the (co)polymer layer overlaying the substrate.

17. The process of claim 15, further comprising applying at least one outer oxide layer overlaying the outer (co)polymer layer, wherein applying the oxide layer comprises evaporating a metal alkoxide and reacting the metal alkoxide with water to form the oxide layer overlaying the (co)polymer layer overlaying the substrate, or sputter depositing an oxide material to form the oxide layer overlaying the (co)polymer layer overlaying the substrate.

18. The process of claim 15, further comprising:
forming a plurality of dyads overlaying the substrate by repeatedly applying the (co)polymer layer to the substrate and applying the oxide layer overlaying the (co)polymer layer to the substrate to create alternating (co)polymer layers and oxide layers between the substrate and the outer (co)polymer layer overlaying the plurality of dyads.

19. The process of claim 15, further comprising:
forming an adhesion-promoting layer positioned between at least one of the substrate and the at least one dyad, the (co)polymer layer and the oxide layer of the at least one dyad, the oxide layer and the outer (co)polymer layer, or the outer (co)polymer layer and the oxide layer overlaying the outer (co)polymer layer, optionally wherein the adhesion promoting layer comprises the reaction product of at least one silane compound.

* * * * *